US012439783B2

(12) United States Patent
Ding et al.

(10) Patent No.: US 12,439,783 B2
(45) Date of Patent: Oct. 7, 2025

(54) DISPLAY SUBSTRATE AND PREPARATION METHOD THEREFOR, AND DISPLAY APPARATUS

(71) Applicants: Hefei BOE Joint Technology Co., Ltd., Anhui (CN); BOE Technology Group Co., Ltd., Beijing (CN)

(72) Inventors: Luke Ding, Beijing (CN); Yongqian Li, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 347 days.

(21) Appl. No.: 17/799,918

(22) PCT Filed: Nov. 12, 2021

(86) PCT No.: PCT/CN2021/130250
§ 371 (c)(1),
(2) Date: Aug. 15, 2022

(87) PCT Pub. No.: WO2022/179189
PCT Pub. Date: Sep. 1, 2022

(65) Prior Publication Data
US 2024/0032355 A1    Jan. 25, 2024

(30) Foreign Application Priority Data
Feb. 26, 2021    (CN) .......................... 202110221026.9

(51) Int. Cl.
*H10K 59/131*    (2023.01)
*G09G 3/3233*    (2016.01)
(Continued)

(52) U.S. Cl.
CPC ......... *H10K 59/131* (2023.02); *G09G 3/3233* (2013.01); *H10K 59/1201* (2023.02);
(Continued)

(58) Field of Classification Search
CPC ............. H10K 59/131; H10K 59/1201; H10K 59/124; H10K 59/121; H10K 59/65;
(Continued)

(56) References Cited

U.S. PATENT DOCUMENTS

| 12,207,526 B2 * | 1/2025 | Gu ....................... H10K 59/879 |
| 2020/0111988 A1 | 4/2020 | Lee |

(Continued)

FOREIGN PATENT DOCUMENTS

| CN | 111009552 A | 4/2020 |
| CN | 210627870 U | 5/2020 |

(Continued)

OTHER PUBLICATIONS

International Search Report for PCT/CN2021/130250 Mailed Feb. 8, 2022.

*Primary Examiner* — Douglas W Owens
(74) *Attorney, Agent, or Firm* — Ling Wu; Stephen Yang; Ling and Yang Intellectual Property

(57) ABSTRACT

A display substrate and a display device are provided. The display substrate includes a light emitting element disposed on a base substrate, and an encapsulation layer, a connection layer, a light extraction layer, a polarization conversion layer and a polarization layer stacked sequentially at a light exiting side of the light emitting element. The light extraction layer is configured to convert at least a portion of light emitted by the light emitting element incident onto the light extraction layer into circularly polarized light with a set rotational direction to pass through the light extraction layer. The polarization conversion layer is configured to convert the circularly polarized light passing through the light extraction layer into linearly polarized light, with a polarization direction parallel to a direction of a light transmission axis of the polarization layer; the connection layer is
(Continued)

configured to bond the light extraction layer to the encapsulation layer.

12 Claims, 11 Drawing Sheets

(51) Int. Cl.
*H10K 59/12* (2023.01)
*H10K 59/124* (2023.01)

(52) U.S. Cl.
CPC ... *H10K 59/124* (2023.02); *G09G 2300/0819* (2013.01); *G09G 2300/0842* (2013.01); *G09G 2310/08* (2013.01)

(58) Field of Classification Search
CPC .. H10K 59/1213; H10K 59/12; G09G 3/3233; G09G 2300/0819; G09G 2300/0842; G09G 2310/08; H10D 10/821; H10D 62/299; H10D 64/511
See application file for complete search history.

(56) References Cited

U.S. PATENT DOCUMENTS

| | | | |
|---|---|---|---|
| 2021/0175316 A1 | 6/2021 | Furukawa | |
| 2022/0130906 A1* | 4/2022 | Wang | G06F 3/0412 |
| 2022/0310710 A1* | 9/2022 | Hu | H10K 59/353 |
| 2022/0320228 A1* | 10/2022 | Du | G09G 3/3291 |
| 2022/0320263 A1* | 10/2022 | Chen | H10K 59/179 |
| 2022/0344448 A1* | 10/2022 | Zhang | H10K 59/122 |
| 2023/0139734 A1* | 5/2023 | Cao | H10D 30/6723 257/40 |
| 2023/0143544 A1* | 5/2023 | Zhang | H10K 59/352 257/40 |
| 2023/0180521 A1* | 6/2023 | Cheng | H10K 59/1216 257/40 |
| 2023/0255067 A1* | 8/2023 | Du | G09G 3/3233 257/40 |
| 2023/0354655 A1* | 11/2023 | Zhang | H10K 59/131 |
| 2023/0363241 A1* | 11/2023 | Su | H10K 59/126 |
| 2024/0032376 A1* | 1/2024 | Hu | H10K 59/122 |
| 2024/0121997 A1* | 4/2024 | Ding | H10K 59/123 |
| 2024/0122032 A1* | 4/2024 | Wang | H10K 59/80522 |
| 2024/0147785 A1* | 5/2024 | Wang | G09F 9/33 |

FOREIGN PATENT DOCUMENTS

| | | |
|---|---|---|
| CN | 112020739 A | 12/2020 |
| CN | 112071882 A | 12/2020 |
| CN | 112951892 A | 6/2021 |

* cited by examiner

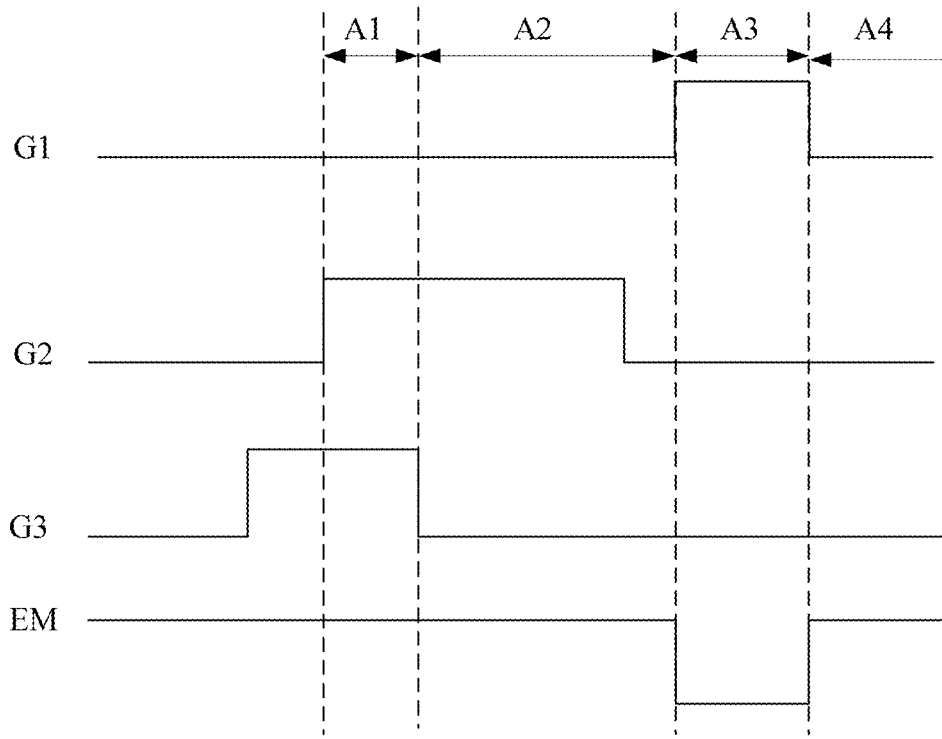

FIG. 15

Forming a drive structure layer on a base substrate, wherein the drive structure layer includes a buffer layer, a semiconductor layer, a first insulating layer, a first gate metal layer, a second insulating layer, a second gate metal layer, a third insulating layer, a first source-drain metal layer, and a planarization layer which are sequentially stacked on the base substrate; at least one of the first gate metal layer and the second gate metal layer includes a first power line extending in a first direction, and the first source-drain metal layer includes a data line extending in a second direction, the first direction intersecting the second direction ~S1

Forming a light emitting element on the drive structure layer ~S2

FIG. 16

DISPLAY SUBSTRATE AND PREPARATION METHOD THEREFOR, AND DISPLAY APPARATUS

CROSS-REFERENCE TO RELATED APPLICATIONS

The present application is a U.S. National Phase Entry of International Application PCT/CN2021/130250 having an international filing date of Nov. 12, 2021 claims priority of Chinese Patent Application No. 202110221026.9, filed to the CNIPA on Feb. 26, 2021 and entitled "Display Substrate and Preparation Method Therefor, and Display Apparatus", and the contents disclosed in the above-mentioned applications are hereby incorporated as a part of this application.

TECHNICAL FIELD

Embodiments of the present disclosure relate to, but are not limited to, the field of display technologies, in particular to a display substrate, a method for preparing the display substrate, and a display apparatus.

BACKGROUND

With the development of technology, appearance of mobile terminals is getting more and more attention. Among them, large-screen terminals having a relatively large screen-to-body ratio are gradually becoming one of mainstream designs of mobile terminals. A large-screen terminal may enhance user's game and entertainment experience, is beneficial to split-screen display, and imparts a higher sense of technology to a complete machine, and therefore can bring stronger visual impacts to users.

Under-screen camera products have become a relatively promising design for display apparatuses today because of their relatively high screen-to-body ratios, relatively low impact of cameras on visual images, etc. However, when a camera is placed under a display panel, the display panel will block light entering the camera, which affects the functions of the front camera such as self-photographing and face recognition.

SUMMARY

The following is a summary of subject matter described herein in detail. The summary is not intended to limit the protection scope of claims.

An embodiment of the present disclosure provides a display substrate, wherein on a plane perpendicular to the display substrate, the display substrate includes a buffer layer disposed on a base substrate, a semiconductor layer disposed on the buffer layer, a first insulating layer overlying the semiconductor layer, a first gate metal layer disposed on the first insulating layer, a second insulating layer overlying the first gate metal layer, a second gate metal layer disposed on the second insulating layer, a third insulating layer overlying the second gate metal layer, a first source-drain metal layer disposed on the third insulating layer, and a planarization layer overlying the first source-drain metal layer; at least one of the first gate metal layer and the second gate metal layer includes a first power supply line extending in a first direction, and the first source-drain metal layer includes a data line extending in a second direction, wherein the first direction intersects the second direction.

In an exemplary embodiment, at least one of the first gate metal layer and the second gate metal layer further includes a light emitting control signal line and at least one scan signal line, the light emitting control signal line and the at least one scan signal line each extend in the first direction, and the first power supply line is located between the light emitting control signal line and the at least one scan signal line.

In an exemplary embodiment, the first power supply line includes at least one first bent part, and the at least one first bent part extends in the second direction.

In an exemplary embodiment, the first source-drain metal layer further includes a second power supply line extending in the second direction, and the first power supply line is electrically connected to the second power supply line through a via hole on the third insulating layer, or through via holes on the third insulating layer and the second insulating layer.

In an exemplary embodiment, the first source-drain metal layer further includes an eighth connection line extending in the second direction, and an orthographic projection of the eighth connection line on the base substrate intersects an orthographic projection of the first power supply line on the base substrate.

In an exemplary embodiment, the semiconductor layer includes a third channel region, a fourth channel region, a fifth channel region, a sixth channel region and a seventh channel region, each of the third channel region, the fourth channel region and the sixth channel region extends in the first direction, the seventh channel region extends in the second direction, the fifth channel region includes a first sub-channel region and a second sub-channel region which are connected to each other, the first sub-channel region extends in the first direction, and the second sub-channel region extends in the second direction.

In an exemplary embodiment, the semiconductor layer includes a reference signal line for supplying a reference voltage signal, and the reference signal line extending in the first direction.

In an exemplary embodiment, the second gate metal layer includes an initial signal line for supplying an initial voltage signal, and the initial signal line includes at least one third bent part, and the at least one third bent part extends in the second direction.

In an exemplary embodiment, the display substrate includes a display area and a mounting area, the mounting area includes a first pixel circuit, and the display area includes a second pixel circuit, wherein each of the first pixel circuit and the second pixel circuit includes at least one transistor, and the number of transistors in the first pixel circuit is smaller than the number of transistors in the second pixel circuit.

In an exemplary embodiment, the display substrate further includes anodes disposed on the planarization layer, wherein the anodes include a first anode and a second anode, the first anode is located in the mounting area, the second anode is located in the display area, and an area of an orthographic projection of the first anode on the base substrate is smaller than an area of an orthographic projection of the second anode on the base substrate.

An embodiment of the present disclosure further provides a display apparatus, including any one of the above display substrates.

An embodiment of the present disclosure further provides a method for preparing a display substrate, including: forming a drive structure layer on a base substrate, wherein the drive structure layer includes a buffer layer disposed on the base substrate, a semiconductor layer disposed on the buffer layer, a first insulating layer overlying the semiconductor layer, a first gate metal layer disposed on the first insulating layer, a second insulating layer overlying the first gate metal layer, a second gate metal layer disposed on the second insulating layer, a third insulating layer overlying the second gate metal layer, a first source-drain metal layer disposed on the third insulating layer, and a planarization layer overlying the first source-drain metal layer; at least one of the first gate metal layer and the second gate metal layer includes a first power supply line extending in a first direction, and the first source-drain metal layer includes a data line extending in a second direction, wherein the first direction intersects the second direction; and forming a light emitting element on the drive structure layer.

Other aspects will become apparent upon reading and understanding of the drawings and detailed description.

BRIEF DESCRIPTION OF DRAWINGS

Accompanying drawings are used to provide a further understanding of technical solutions of the present disclosure and form a part of the specification. Together with the embodiments of the present disclosure, they are used to explain the technical solutions of the present disclosure and do not constitute a limitation on the technical solutions of the present disclosure. Shapes and dimensions of components in the drawings do not reflect actual scales, and are only intended to schematically illustrate contents of the present disclosure.

FIG. 15 is an operation timing diagram of the second pixel circuit shown in FIG. 14.

FIG. 16 is a flowchart of a method for preparing a display substrate according to an embodiment of the present disclosure.

DETAILED DESCRIPTION

Figure 1:
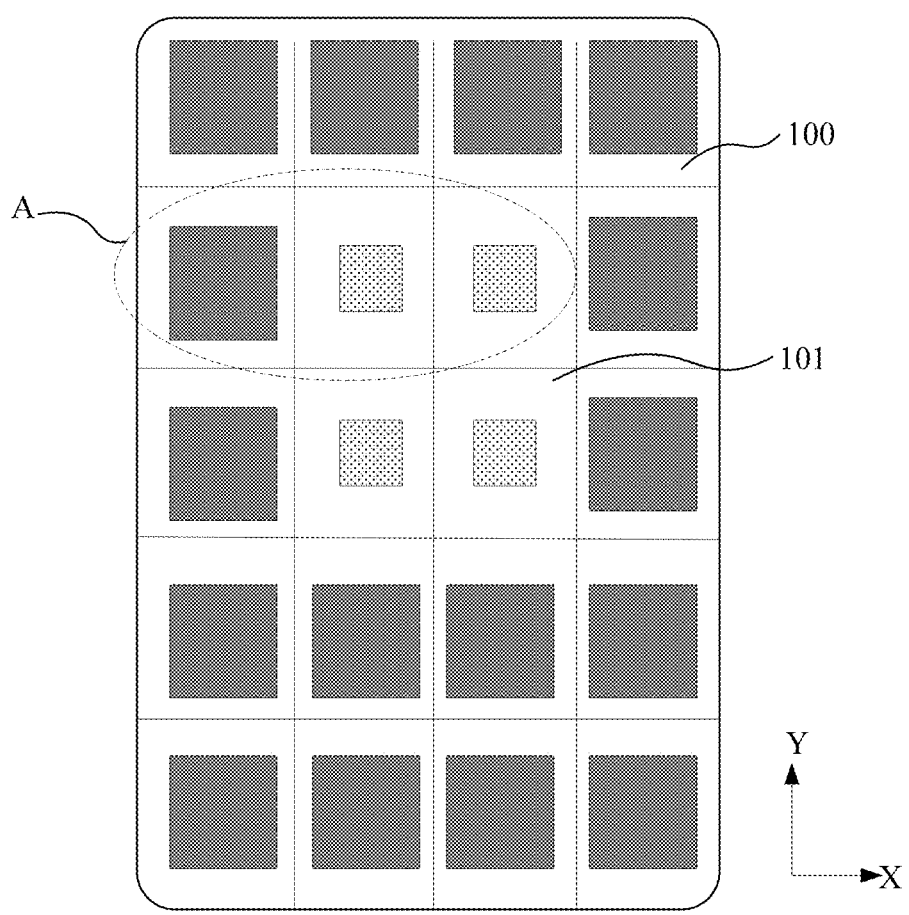
FIG. 1 is a schematic diagram of a structure of a display substrate according to an embodiment of the present disclosure.

In order to make objectives, technical solutions and advantages of the present disclosure more clear, embodiments of the present disclosure will be described below in detail with reference to the drawings. It is to be noted that implementation modes may be carried out in multiple different forms. Those of ordinary skills in the art may easily understand such a fact that implementation modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined with each other randomly if there is no conflict.

In the drawings, a size of each constituent element, a thickness of a layer, or a region is exaggerated sometimes for clarity. Therefore, one implementation mode of the present disclosure is not necessarily limited to the sizes, and shapes and sizes of the components in the drawings do not reflect actual scales. In addition, the drawings schematically illustrate ideal examples, and one implementation mode of the present disclosure is not limited to the shapes, numerical values, or the like shown in the drawings.

Ordinal numerals such as "first", "second", and "third" in the specification are set to avoid confusion between constituent elements, but not to set a limit in quantity.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions according to which the constituent elements are described. Therefore, the wordings are not limited to those described in the specification, but may be replaced appropriately according to situations.

In the specification, unless otherwise specified and defined explicitly, terms "mount", "link" and "connect" should be understood in a broad sense, which, for example, may be a fixed connection, or a detachable connection, or an integrated connection; may be a mechanical connection or an electrical connection; may be a direct connection, or an indirect connection through middleware, or internal communication between two elements. Those of ordinary skills in the art may understand specific meanings of these terms in the present disclosure according to specific situations.

In the specification, a transistor refers to an element which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region and the source electrode. It is to be noted that, in the specification, the channel region refers to a region through which the current mainly flows.

In the specification, a first electrode may be a drain electrode, and a second electrode may be a source electrode. Or, a first electrode may be a source electrode, and a second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, an "electric connection" includes a case where constituent elements are connected together through an element having some electrical function. There is no specific restriction on the "element having some electrical function" as long as it allows transmission and receiving of electrical signals between connected constituent elements. An example of the "element having some electrical function" includes not only an electrode and a wiring, but also a switching element such as a transistor, a resistor, an inductor, a capacitor, or other elements having various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, "film" and "layer" may be exchanged. For example, a "conductive layer" may be replaced with a "conductive film" sometimes. Similarly, an "insulating film" may be replaced with an "insulating layer" sometimes.

In the present disclosure, "about" refers to that a boundary is defined not so strictly and numerical values within process and measurement error ranges are allowed.

Figure 2:
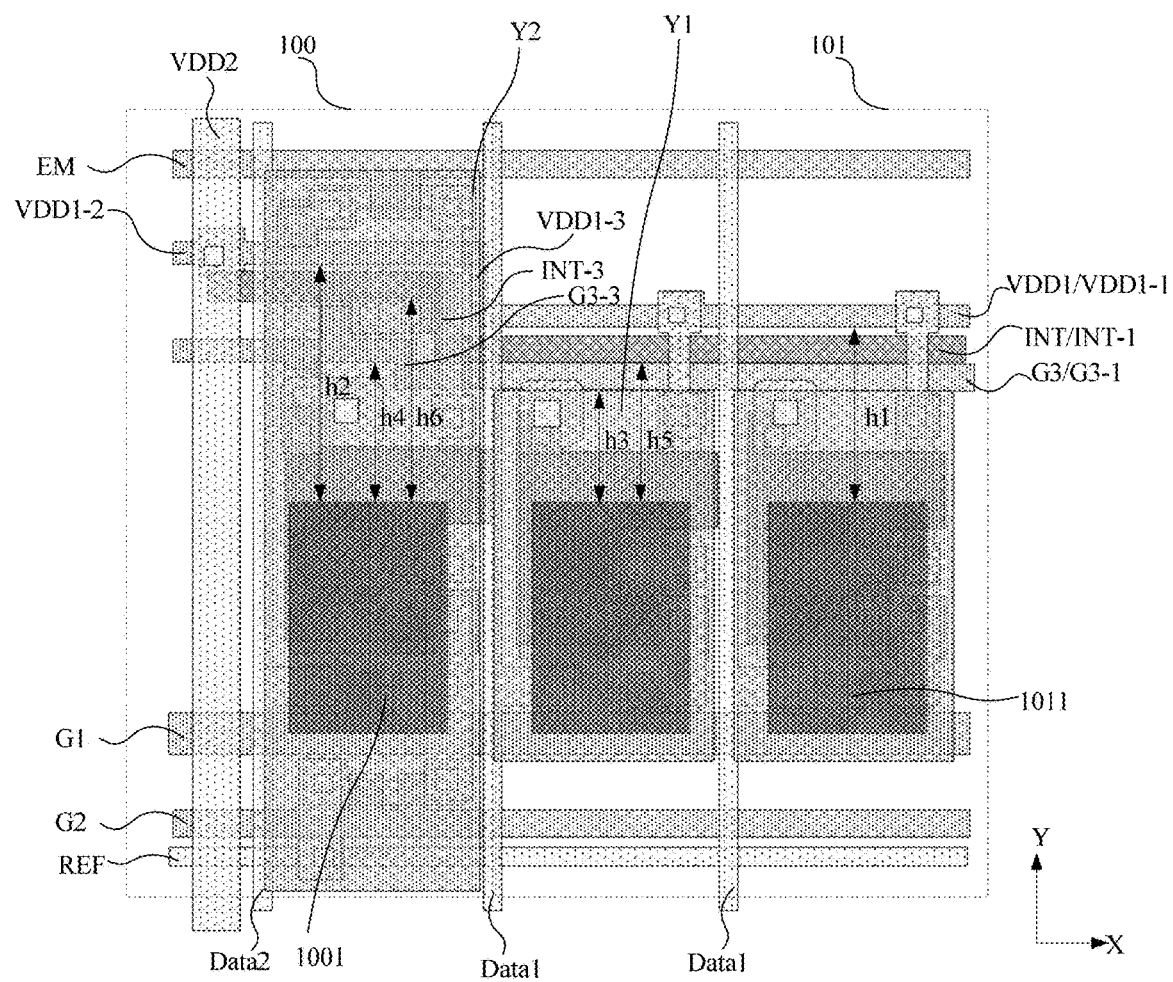
FIG. 2 is an enlarged schematic diagram of a structure of area A in FIG. 1.
Figure 3:
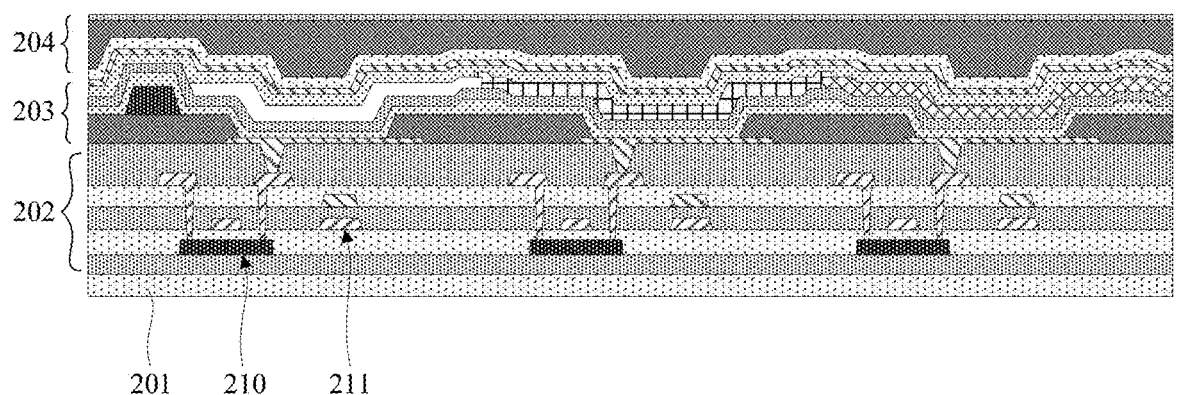
FIG. 3 is a schematic diagram of a sectional structure of a display substrate according to an embodiment of the present disclosure.

FIG. 1 is a schematic diagram of a structure of a display substrate according to an embodiment of the present disclosure, FIG. 2 is a schematic diagram of an enlarged structure of area A in FIG. 1, and FIG. 3 is a schematic diagram of a sectional structure of a display substrate according to an embodiment of the present disclosure. As shown in FIG. 1, FIG. 2 and FIG. 3, an embodiment of the present disclosure provides a display substrate, including a display area 100.

On a plane perpendicular to the display substrate, the display substrate includes a base substrate 201, a buffer layer disposed on the base substrate 201, a semiconductor layer disposed on the buffer layer, a first insulating layer overlying the semiconductor layer, a first gate metal layer disposed on the first insulating layer, a second insulating layer overlying the first gate metal layer, a second gate metal layer disposed on the second insulating layer, a third insulating layer overlying the second gate metal layer, a first source-drain metal layer disposed on the third insulating layer, and a planarization layer overlying the first source-drain metal layer.

At least one of the first gate metal layer and the second gate metal layer includes a first power supply line VDD1 extending in a first direction X, and the first source-drain metal layer includes a data line (e.g., a first data line Data1 or a second data line Data2 in FIG. 2) extending in a second direction Y, wherein the first direction X intersects the second direction Y.

In some exemplary embodiments, the first direction X and the second direction Y may be in a same plane, and the first direction X may be perpendicular to the second direction Y. For example, the first direction X may be a row direction parallel to an extension direction of a scan line, and the second direction Y may be a column direction parallel to an extension direction of a data line.

Figure 4:
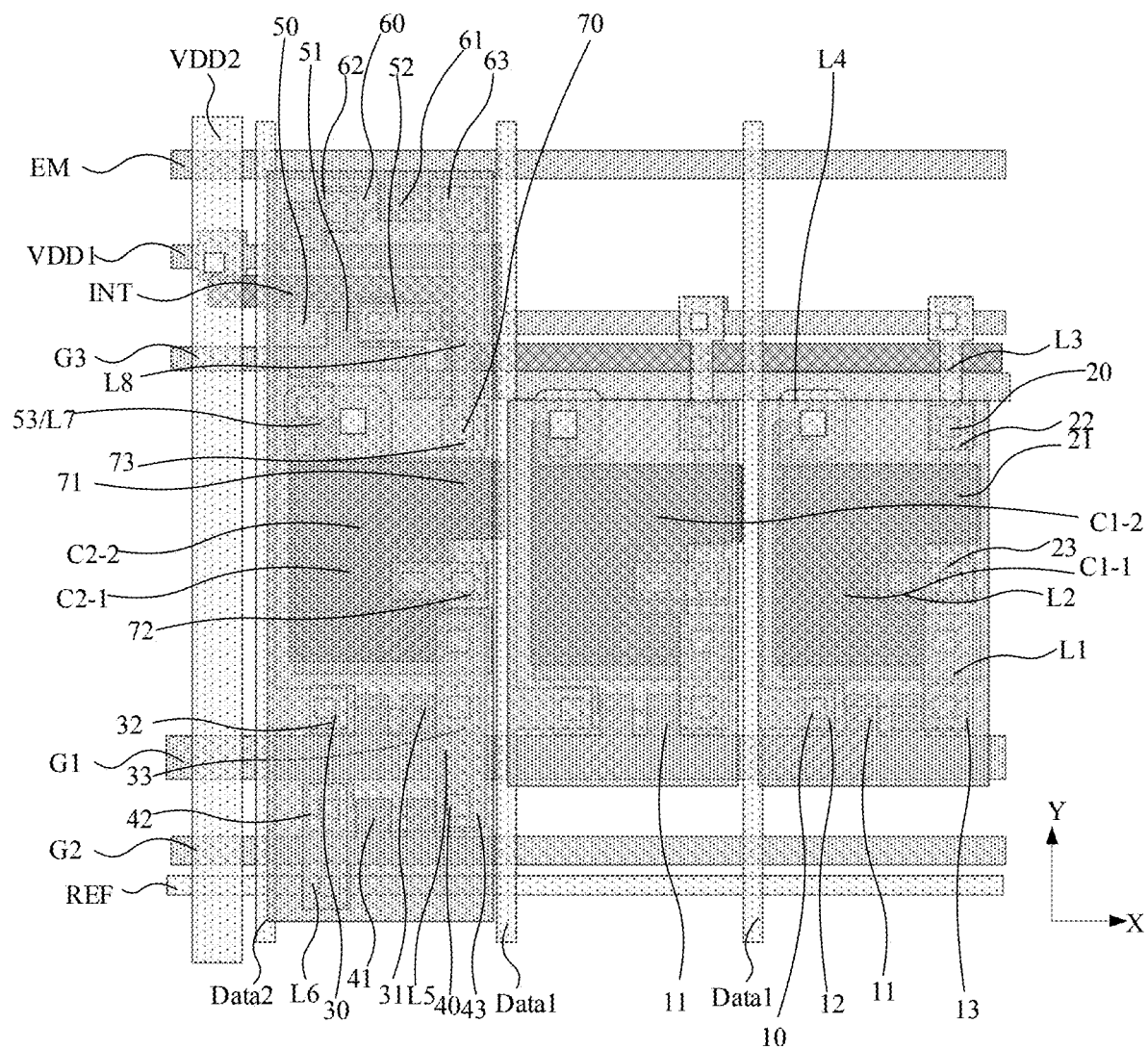
FIG. 4 is a schematic diagram of a planar structure of a display substrate according to an embodiment of the present disclosure.

In some exemplary embodiments, as shown in FIG. 4, at least one of the first gate metal layer and the second gate metal layer further includes a light emitting control signal line EM and at least one scan signal line (e.g., a first scan signal line G1, a second scan signal line G2 and a third scan signal line G3 in FIG. 4), the light emitting control signal line EM and the scan signal line each extend in the first direction X, and the first power supply line VDD1 is located between the light emitting control signal line EM and the at least one scan signal line.

In some exemplary embodiments, as shown in FIG. 4, the first source-drain metal layer further includes an eighth connection line L8, wherein the eighth connection line L8 extends in the second direction Y, and an orthographic projection of the eighth connection line L8 on the base substrate 201 intersects an orthographic projection of the first power supply line VDD1 on the base substrate 201.

In some exemplary embodiments, as shown in FIG. 4, the first source-drain metal layer further includes a second power supply line VDD2, wherein the second power supply line VDD2 extends in the second direction Y, and the first power supply line VDD1 is electrically connected to the second power supply line VDD2 through a via hole on the third insulating layer, or through via holes on the third insulating layer and the second insulating layer.

In some exemplary embodiments, as shown in FIG. 4, the first power supply line VDD1 includes at least one first bent part, wherein the at least one first bent part extends in the second direction Y, i.e., an extension direction of the at least one first bent part is parallel to an extension direction of the second power supply line VDD2.

Figure 5:
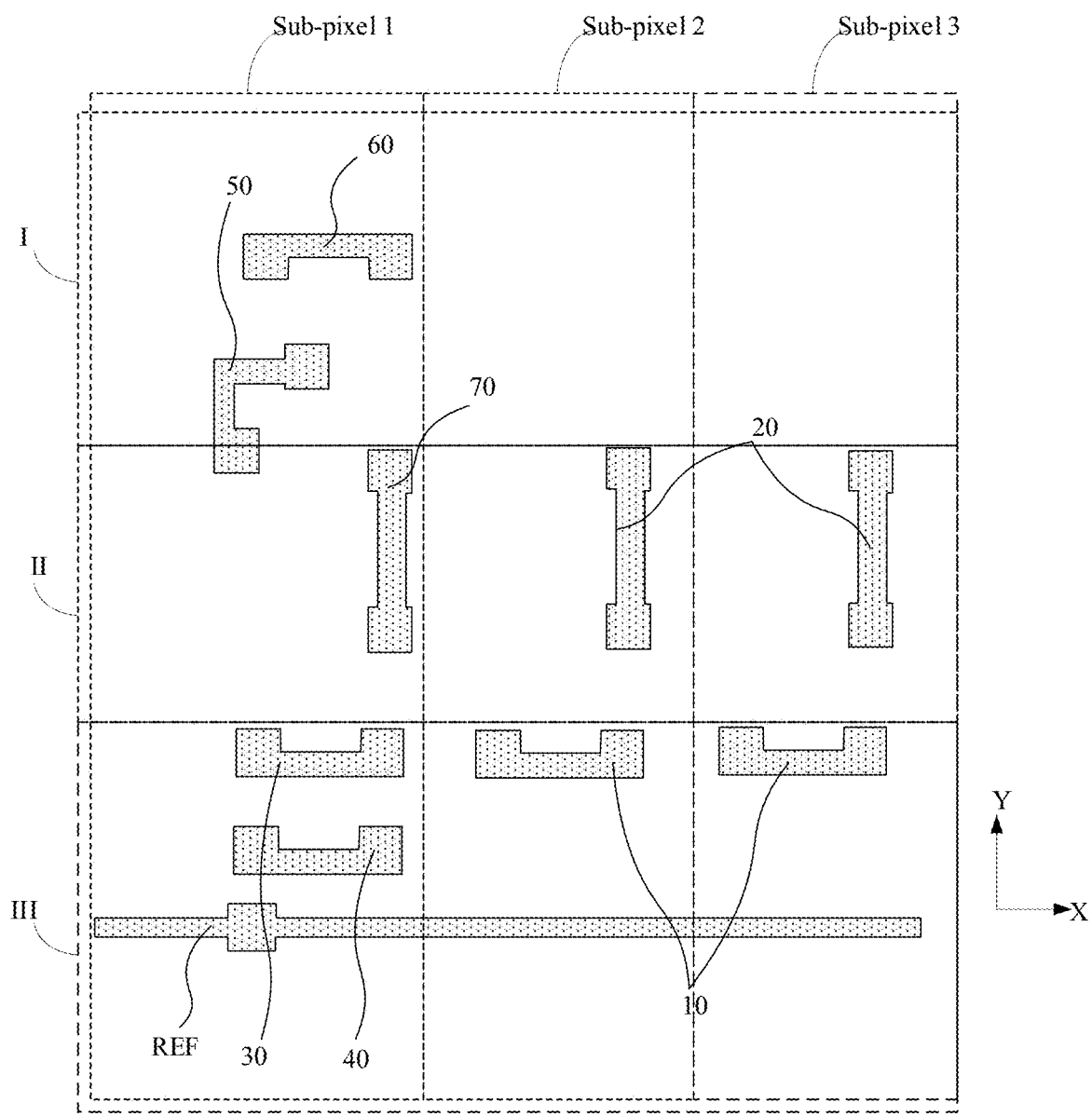
FIG. 5 is a schematic diagram of a structure of a semiconductor layer of a display substrate according to an embodiment of the present disclosure.

In some exemplary embodiments, as shown in FIG. 5, the semiconductor layer includes a reference signal line REF for supplying a reference voltage signal, wherein the reference signal line REF extends in the first direction X.

In some exemplary embodiments, as shown in FIG. 5, the semiconductor layer includes a third channel region, a fourth channel region, a fifth channel region, a sixth channel region and a seventh channel region. The third channel region, the fourth channel region and the sixth channel region each extend in the first direction X, the seventh channel region extends in the second direction Y, the fifth channel region includes a first sub-channel region and a second sub-channel region which are connected to each other, the first sub-channel region extends in the first direction X, and the second sub-channel region extends in the second direction Y.

In some exemplary embodiments, as shown in FIG. 1 and FIG. 5, the display area includes a plurality of sub-pixels arranged in an array, wherein each sub-pixel is divided into region I, region II and region III from top to bottom in the second direction Y. The fifth channel region and the sixth channel region are located in region I, the seventh channel region is located in region II, and the third channel region, the fourth channel region and the reference signal line REF are located in region III.

In some exemplary embodiments, as shown in FIG. 5, the fifth channel region is located on a side of the sixth channel region close to region II, the seventh channel region is located on a side of an edge of region II in the first direction X, the third channel region is located on a side of region III close to an edge of region II, and the fourth channel region is located between the reference signal line REF and the third channel region.

Figure 6:
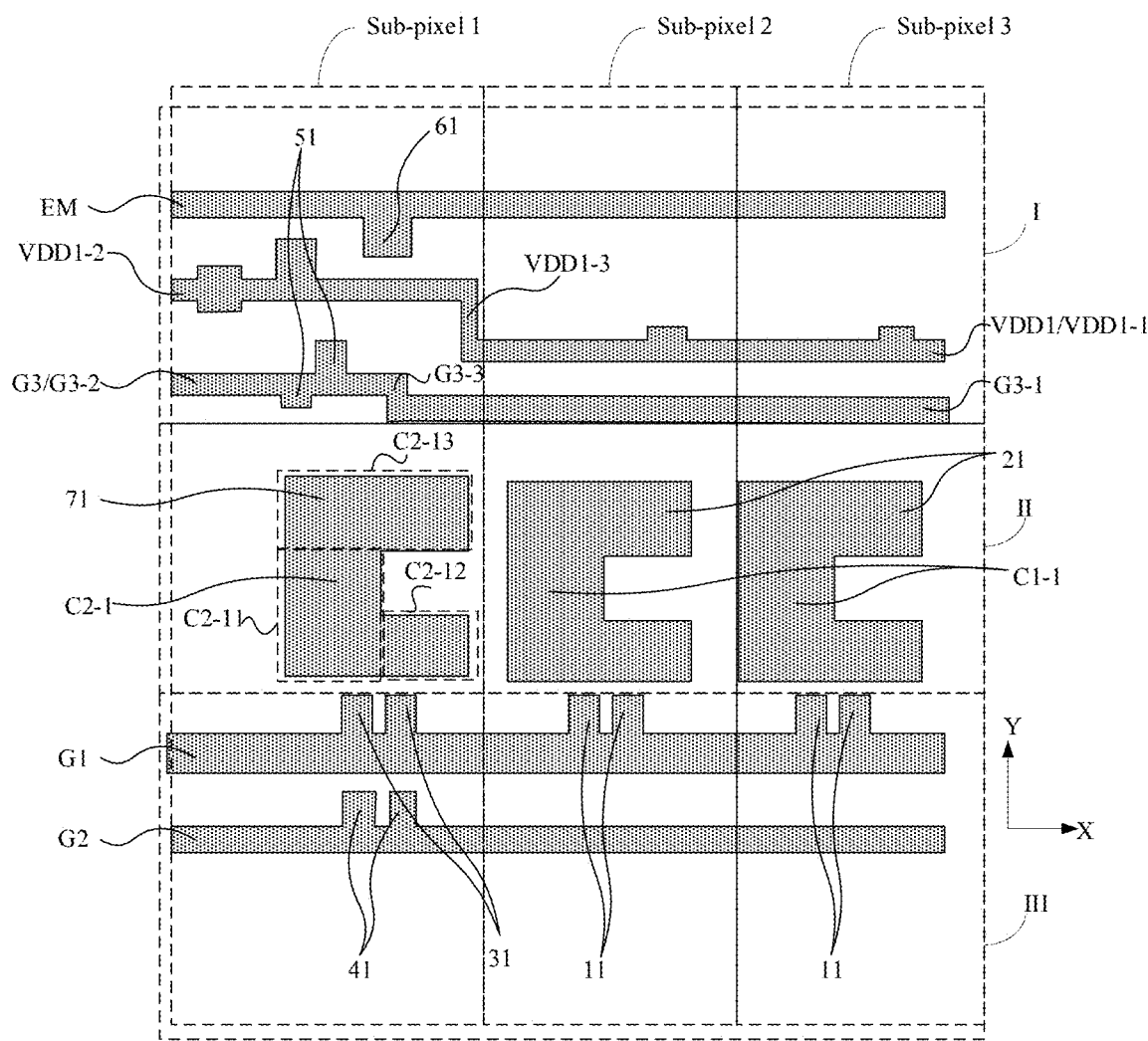
FIG. 6 is a schematic diagram of a structure of a first gate metal layer of a display substrate according to an embodiment of the present disclosure.

In some exemplary embodiments, as shown in FIG. 6, the first gate metal layer includes a first scan signal line G1, a second scan signal line G2, a third scan signal line G3, a first power supply line VDD1, a light emitting control signal line EM and a third electrode plate C2-1 of a second capacitor C2. The light emitting control signal line EM, the first power supply line VDD1 and the third scan signal line G3 are located in region I, the third electrode plate C2-1 of the second capacitor C2 is located in region II, and the first scan signal line G1 and the second scan signal line G2 are located in region III.

In some exemplary embodiments, as shown in FIG. 6, the light emitting control signal line EM is located on a side of the first power supply line VDD1 away from region II, the first power supply line VDD1 is located on a side of the third scan signal line G3 away from region II, the third scan signal line G3 is located on a side of region I close to an edge of region II, and the first scan signal line G1 is located on a side of the second scan signal line G2 close to region II.

In some exemplary embodiments, as shown in FIG. 6, the first scan signal line G1 includes at least two first protrusions, wherein the two first protrusions are both located on a side of the first scan signal line G1 close to region II, there is an overlapping area between an orthographic projection of the two first protrusions on the base substrate and an orthographic projection of the third channel region on the base substrate, and the two first protrusions form a double gate structure of a third transistor T3.

In some exemplary embodiments, as shown in FIG. 6, the second scan signal line G2 includes at least two second protrusions, wherein the two second protrusions are both located on a side of the second scan signal line G2 close to region II, there is an overlapping area between an orthographic projection of the two second protrusions on the base substrate and an orthographic projection of the fourth channel region on the base substrate, and the two second protrusions form a double gate structure of a fourth transistor T4.

In some exemplary embodiments, as shown in FIG. 6, the third scan signal line G3 includes at least two third protrusions, wherein the two third protrusions include an upper sub-protrusion and a lower sub-protrusion. The upper sub-protrusion is located on the side of the third scan signal line G3 away from region II, there is an overlapping area between an orthographic projection of the upper sub-projection on the base substrate and an orthographic projection of the first sub-channel region of the fifth channel region on the base substrate, the lower sub-projection is located on a side of the third scan signal line G3 close to region II, there is an overlapping area between an orthographic projection of the lower sub-projection on the base substrate and an orthographic projection of the second sub-channel region of the fifth channel region on the base substrate, and the two third projections form a double gate structure of a fifth transistor T5.

In some exemplary embodiments, as shown in FIG. 6, the third scan signal line G3 includes at least one second bent part G3-3, wherein the at least one second bent part G3-3 extends in the second direction Y, i.e., an extension direction of a third bent part INT-3 is parallel to the extension direction of the second power supply line VDD2.

In some exemplary embodiments, as shown in FIG. 6, the light emitting control signal line EM includes at least one fourth protrusion on its side close to region II, wherein the at least one fourth protrusion is located on a side of the light emitting control signal line EM close to region II, and there is an overlapping area between an orthographic projection of the fourth protrusion on the base substrate and an orthographic projection of the sixth channel region on the base substrate, i.e., the fourth protrusion forms a control electrode 61 of a sixth transistor T6.

In some exemplary embodiments, as shown in FIG. 6, the third electrode plate C2-1 includes a first main body region C2-11, a writing potential region C2-12, and an enlarged overlapping area region C2-13, wherein the enlarged overlapping area region C2-13 is located on a side of the third electrode plate C2-1 close to region I, the first main body region C2-11 and the writing potential region C2-12 are located on a side of the third electrode plate C2-1 close to region III, and the first main body region C2-11, the writing potential region C2-12, and the enlarged overlapping area region C2-13 form a "C"-shaped structure.

In some exemplary embodiments, as shown in FIG. 6, the third electrode plate C2-1 is disposed between the first power supply line VDD1 and at least one scan signal line, and, for example, the third electrode plate C2-1 is disposed between the first power supply line VDD1 and the first scan signal line G1, or the third electrode plate C2-1 is disposed between the first power supply line VDD1 and the second scan signal line G2.

Figure 7:
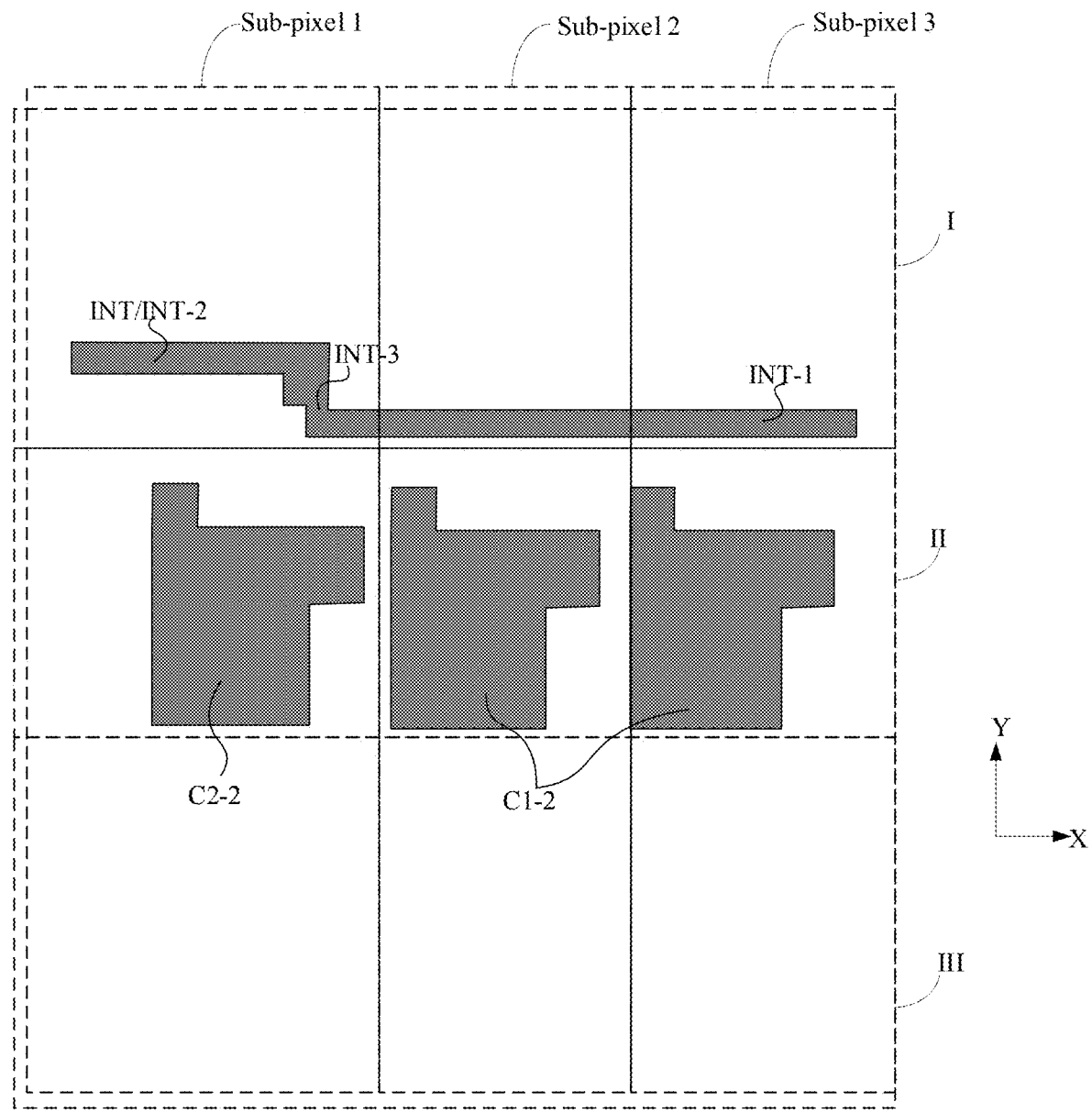
FIG. 7 is a schematic diagram of a structure of a second gate metal layer of a display substrate according to an embodiment of the present disclosure.

In some exemplary embodiments, as shown in FIG. 7, the second gate metal layer includes a fourth electrode plate C2-2 of the second capacitor C2, wherein the fourth electrode plate C2-2 is located in region II.

In some exemplary embodiments, as shown in FIG. 7, the fourth electrode plate C2-2 includes a second main body region C2-21 and a signal connection region C2-22, wherein the signal connection region C2-22 is located on a side of the fourth electrode plate C2-2 close to an edge of region I, the signal connection region C2-22 is connected to a seventh connection line L7 through a via hole on the third insulating layer, for transmitting signals to the seventh connection line L7, and transmitting signals to an anode of an organic light emitting diode through the seventh connection line L7.

In some exemplary embodiments, as shown in FIG. 7, the second gate metal layer further includes an initial signal line INT, wherein the initial signal line INT extends in the first direction X, and the first source-drain metal layer includes a data line (e.g., the first data line Data1 or the second data line Data2 in FIG. 2) extending in the second direction Y, and the first direction X intersects the second direction Y.

In some exemplary embodiments, as shown in FIG. 7, the initial signal line INT includes at least one third bent part INT-3, wherein the third bent part INT-3 extends in the second direction Y, i.e., an extension direction of the third bent part INT-3 is parallel to the extension direction of the second power supply line VDD2.

Figure 8:
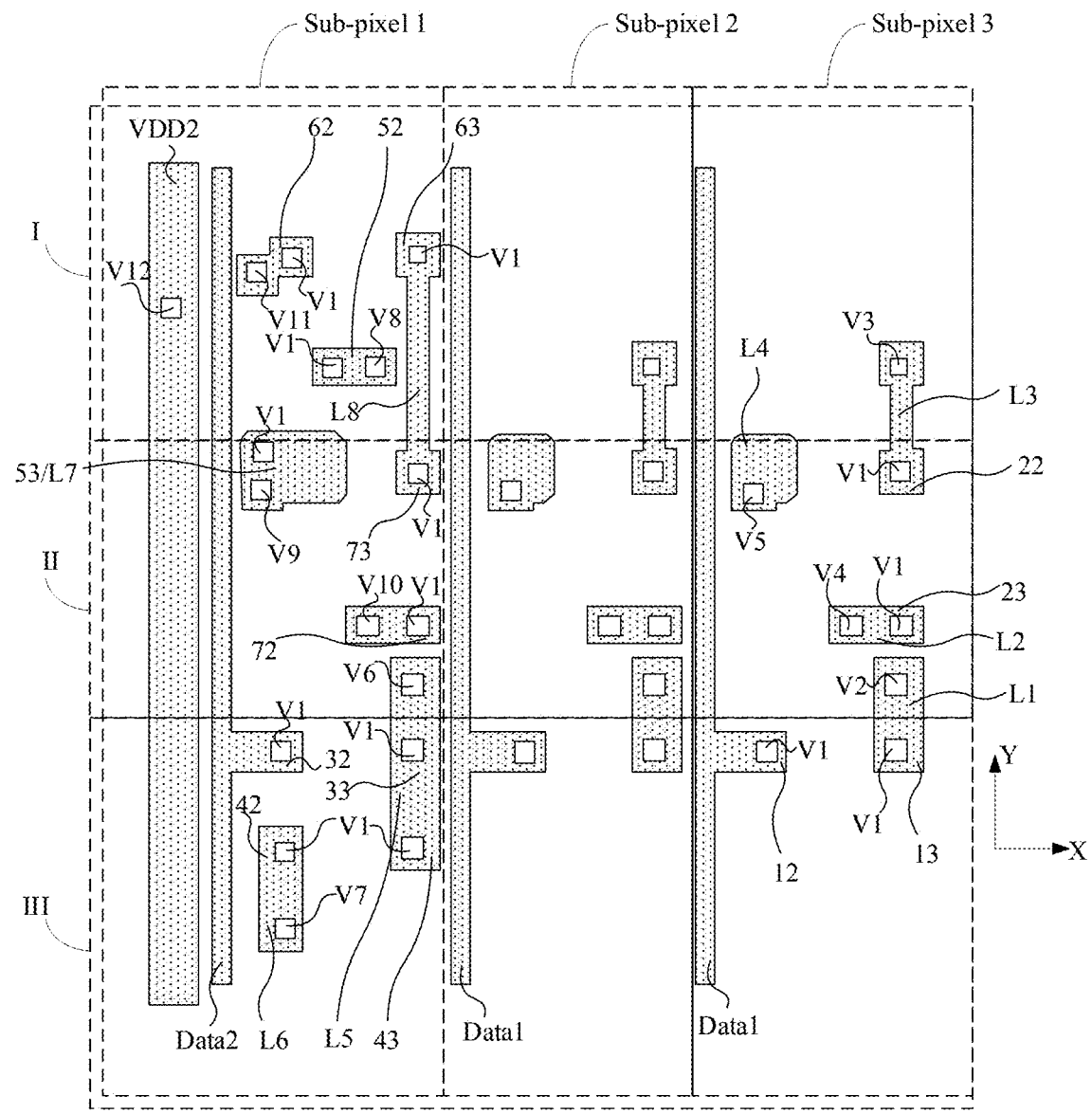
FIG. 8 is a schematic diagram of a structure of a first source-drain metal layer of a display substrate according to an embodiment of the present disclosure.

In some exemplary embodiments, as shown in FIG. 8, the first source-drain metal layer includes a second power supply line VDD2, a second data line Data2, at least one connection line and a source electrode and a drain electrode of at least one transistor, wherein the second power supply line VDD2 and the second data line Data2 each extend in the second direction Y, and the second power supply line VDD2 and the second data line Data2 are located on a side of a sub-pixel, and the second power supply line VDD2 is located on a side of the second data line Data2 close to an edge of the sub-pixel.

In some exemplary embodiments, as shown in FIG. 8, the first source-drain metal layer includes a fifth connection line L5, a sixth connection line L6, a seventh connection line L7, an eighth connection line L8, a first electrode 32 and a second electrode 33 of the third transistor T3, a first electrode 42 and a second electrode 43 of the fourth transistor T4, a first electrode 52 and a second electrode 53 of the fifth transistor T5, a first electrode 62 and a second electrode 63 of the sixth transistor T6, and a first electrode 72 and a second electrode 73 of a seventh transistor T7. The first electrode 32 of the third transistor T3 and the second data signal line Data2 are connected to each other to form an integrated structure, the second electrode 33 of the third transistor T3, the second electrode 43 of the fourth transistor T4 and the fifth connection line L5 are connected to each other to form an integrated structure, and the fifth connection line L5 is connected to a control electrode 71 of the seventh transistor T7 and the third electrode plate C2-1 of the second capacitor C2 through via holes on the second insulating layer and the third insulating layer. The first electrode 42 of the fourth transistor T4 and the sixth connection line L6 are connected to each other to form an integrated structure, and the sixth connection line L6 is connected to the reference signal line REF through a via hole on the first insulating layer, the second insulating layer and the third insulating layer. The first electrode 52 of the fifth transistor T5 is electrically connected to the initial signal line INT through the via hole on the third insulating layer, the second electrode 53 of the fifth transistor T5 and the seventh connection line L7 are connected to each other to form an integrated structure, and the seventh connection line L7 is electrically connected to the fourth electrode plate C2-2 of the second capacitor C2 through the via hole on the third insulating layer. The first electrode 72 of the seventh transistor T7 is electrically connected to the fourth electrode plate C2-2 of the second capacitor C2 through the via hole on the third insulating layer. The first electrode 62 of the sixth transistor T6 is electrically connected to the first power supply line VDD1 through the via holes on the second insulating layer and the third insulating layer, and the second electrode 63 of the sixth transistor T6 and the eighth connection line L8 and the second electrode 73 of the seventh transistor T7 are connected to each other to form an integrated structure.

In some exemplary embodiments, as shown in FIG. 1, FIG. 2 and FIG. 4, the display substrate further includes a mounting area 101 located in the display area 100.

In some exemplary embodiments, the mounting area 101 may be an under-screen camera area.

In some exemplary embodiments, a pixel resolution of the display area 100 is higher than a pixel resolution of the mounting area 101. For example, the pixel resolution of the display area 100 may be 2K and the pixel resolution of the mounting area 101 may be 1080.

In some other exemplary embodiments, the display area 100 includes a plurality of first metal wires, and the mounting area 101 includes a plurality of second metal wires in one-to-one correspondence with the plurality of first metal wires in the display area 100, wherein a line width of each second metal wire is smaller than or equal to a line width of the corresponding first metal wire.

In an exemplary embodiment, as shown in FIG. 2, on a plane perpendicular to the display substrate, the display substrate includes a base substrate 201, a plurality of metal layers disposed on the base substrate 201, and an insulating layer disposed between the plurality of metal layers. The plurality of metal layers include a first power supply line VDD1 and a second power supply line VDD2, wherein the first power supply line VDD1 extends in the first direction X, and the second power supply line VDD2 extends in the second direction Y, and the first direction X intersects the second direction Y;

the second power supply line VDD2 is located only in the display area 100, the first power supply line VDD1 includes a first connection part VDD1-1 located in the mounting area 101 and a second connection part VDD1-2 located in the display area 100 and connected to the first connection part VDD1-1, and the second connection part VDD1-2 and the second power supply line VDD2 are connected to each other through a via hole on the insulating layer.

In the display substrate according to an embodiment of the present disclosure, by not providing the second power supply line VDD2 in the mounting area 101, an area occupied by metal wires in the mounting area 101 is effectively reduced, light transmittance of the mounting area 101 is increased, and photographing functions of the front camera such as self-photographing and face recognition are improved.

Figure 9:
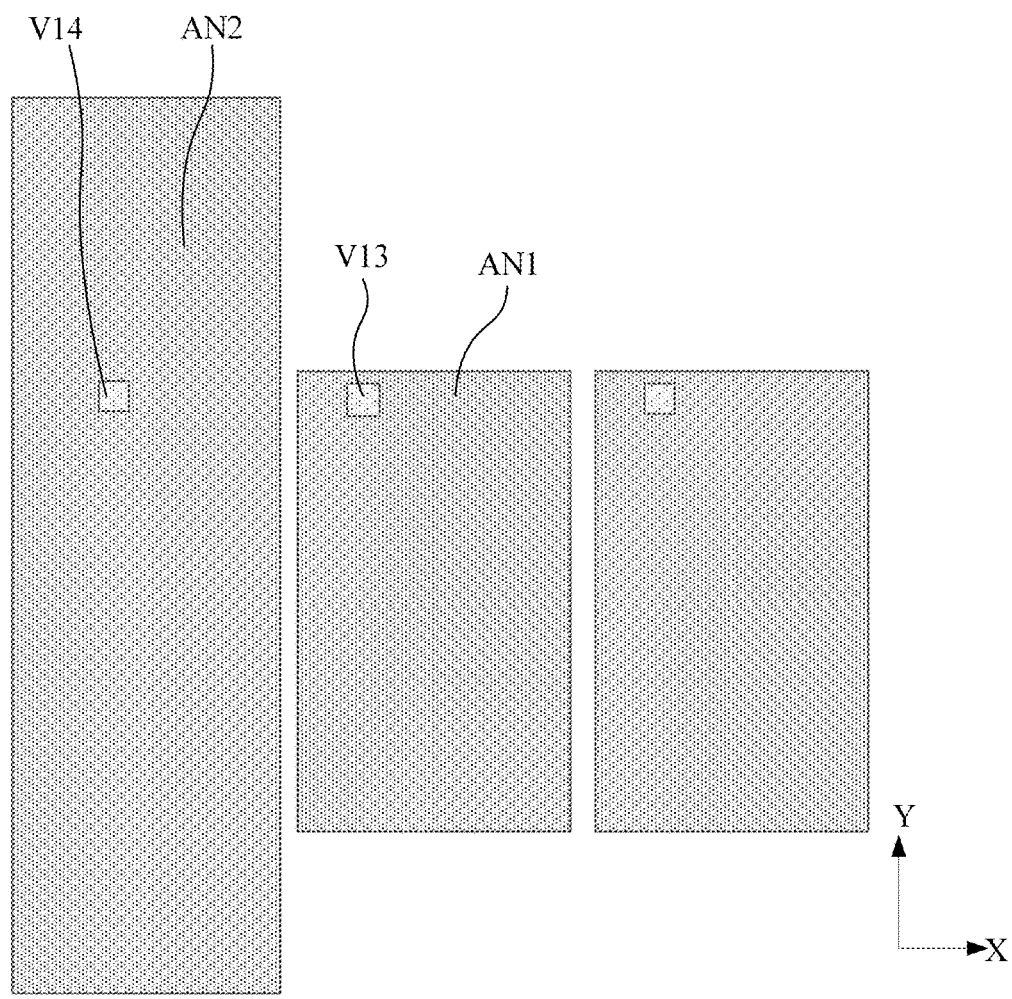
FIG. 9 is a schematic diagram of a structure of an anode layer of a display substrate according to an embodiment of the present disclosure.

In some exemplary embodiments, as shown in FIG. 9, a sub-pixel in the mounting area 101 includes a first anode AN1, and a sub-pixel in the display area 100 includes a second anode AN2, the first anode AN1 is connected to the fourth connection line L4 through a thirteenth via hole V13, and the second anode AN2 is connected to the seventh connection line L7 through a fourteenth via hole V14.

In some exemplary embodiments, an area of an orthographic projection of the first anode AN1 on the base substrate is smaller than an area of an orthographic projection of the second anode AN2 on the base substrate. In some exemplary embodiments, as shown in FIG. 2 and FIG. 10, the mounting area 101 includes a plurality of first pixel opening regions 1011 and the display area 100 includes a plurality of second pixel opening regions 1001.

Figure 10:
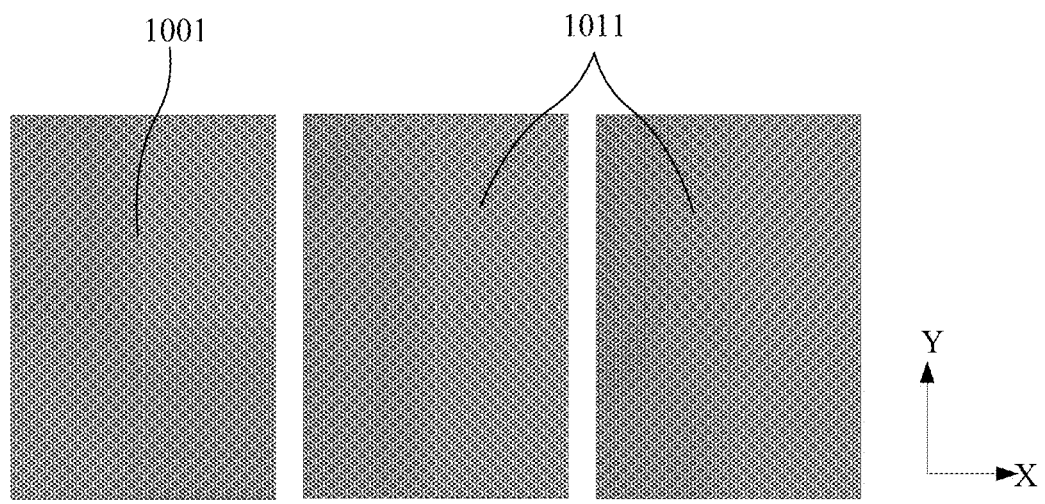
FIG. 10 is a schematic diagram of a structure of a pixel definition layer of a display substrate according to an embodiment of the present disclosure.

In some exemplary embodiments, as shown in FIG. 2 and FIG. 10, an opening size of the first pixel opening region 1011 and an opening size of the second pixel opening region 1001 may be the same.

In some exemplary embodiments, as shown in FIG. 2, the first power supply line VDD1 further includes a first bent part VDD1-3 connected between the first connection part VDD1-1 and the second connection part VDD1-2, and the first bent part VDD1-3 is configured such that a distance h1 between the first connection part VDD1-1 and the first pixel opening region 1011 is smaller than a distance h2 between the second connection part VDD1-2 and the second pixel opening region 1001.

In some exemplary embodiments, as shown in FIG. 3, on a plane perpendicular to the display substrate, the display substrate may include a drive structure layer 202 disposed on the base substrate 201, a light emitting element 203 disposed on a side of the drive structure layer 202 away from the base substrate 201, and an encapsulation layer 204 disposed on a side of the light emitting element 203 away from the base substrate 201. In some possible implementations, the display substrate may include other film layers, e.g., post spacers, etc., which is not limited here in the present disclosure.

In an exemplary implementation, the base substrate 201 may be a flexible base or a rigid base. The drive structure layer 202 of each sub-pixel may include a plurality of transistors and a storage capacitor which form a pixel drive circuit. FIG. 3 illustrates an example where each sub-pixel includes one drive transistor 210 and one storage capacitor 211. In some possible implementations, the drive structure layer 202 of each sub-pixel may include: a buffer layer disposed on the base substrate 201; an active layer disposed on the buffer layer; a first insulating layer overlying the active layer; a first gate metal layer disposed on the first insulating layer; a second insulating layer overlying the first gate metal layer; a second gate metal layer disposed on the second insulating layer; a third insulating layer overlying the second gate metal layer, the first insulating layer, the second insulating layer and the third insulating layer being provided with a via hole exposing the active layer; a first source-drain metal layer disposed on the third insulating layer, the first source-drain metal layer including a source electrode and a drain electrode which are connected respectively to the active layer through a via hole; and a planarization layer overlying the aforementioned structures, the planarization layer being provided with a via hole exposing a drain electrode of the drive transistor 210.

In some exemplary embodiments, as shown in FIG. 4, the drive structure layer of the mounting area 101 includes a first pixel circuit, and the drive structure layer of the display area 100 includes a second pixel circuit, the first pixel circuit and the second pixel circuit each include at least one transistor, and the number of transistors in the first pixel circuit is smaller than the number of transistors in the second pixel circuit.

In the display substrate according to an embodiment of the present disclosure, by disposing a first pixel circuit in the drive structure layer in the mounting area 101 and disposing a second pixel circuit in the drive structure layer in the display area 100, and making the number of transistors in the first pixel circuit smaller than that in the second pixel circuit, the area occupied by the metal wires in the mounting area 101 is effectively reduced, the light transmittance of the mounting area 101 is increased, and the photographing functions of the front camera such as self-photographing and face recognition are improved.

In some exemplary embodiments, the first pixel circuit may employ a design structure such as 2T1C, 3T1C or 5T1C, and the second pixel circuit may employ a design structure such as 3T1C, 5T1C or 7T1C, which is not limited in the embodiments of the present disclosure.

Figure 11:
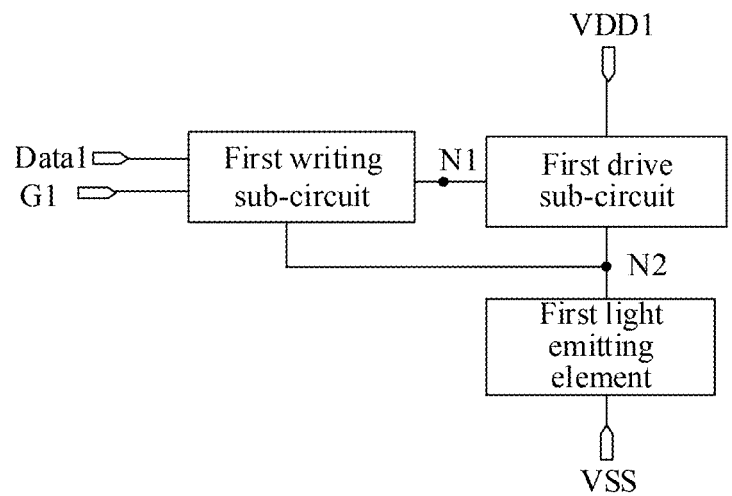
FIG. 11 is a schematic diagram of a structure of a first pixel circuit according to an embodiment of the present disclosure.

In some exemplary embodiments, as shown in FIG. 11, the first pixel circuit may include a first writing sub-circuit and a first drive sub-circuit. The first writing sub-circuit is connected to the first data signal line Data1, the first scan signal line G1, a first node N1 and a second node N2 respectively, and is configured to supply a signal of the first data signal line Data1 to the first node N1 under control of a signal of the first scan signal line G1, and store a voltage between the first node N1 and the second node N2. The first drive sub-circuit is connected to the first power supply line VDD1, the first node N1 and the second node N2 respectively, and is configured to generate a drive current for driving a first light emitting element D1 to emit light.

Figure 12:
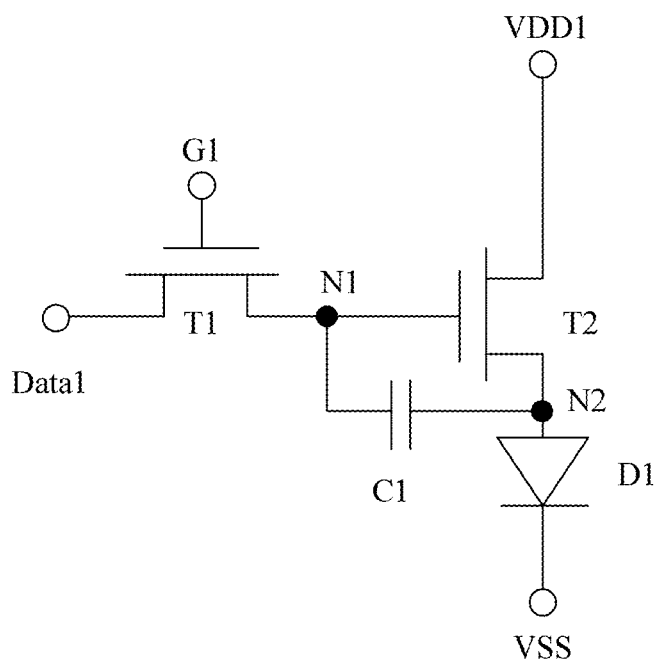
FIG. 12 is an equivalent circuit diagram of a first pixel circuit according to an embodiment of the present disclosure.

In some exemplary embodiments, as shown in FIG. 12, the first writing sub-circuit includes a first transistor T1 and a first capacitor C1, and the first drive sub-circuit includes a second transistor T2, wherein the first transistor T1 is a switching transistor, the second transistor T2 is a drive transistor, and the first capacitor C1 is a storage capacitor.

A control electrode of the first transistor T1 is electrically connected to the first scan signal line G1, a first electrode of the first transistor T1 is electrically connected to the first data signal line Data1, and a second electrode of the first transistor T1 is electrically connected to the first node N1. A control electrode of the second transistor T2 is electrically connected to the first node N1, a first electrode of the second transistor T2 is electrically connected to the first power supply line VDD1, and a second electrode of the second transistor T2 is electrically connected to the second node N2. One end of the first light emitting element D1 is electrically connected to the second node N2, and the other end of the first light emitting element D1 is electrically connected to a voltage stabilizing line VSS. One end of the first capacitor C1 is electrically connected to the first node N1, and the other end of the first capacitor C1 is electrically connected to the second node N2.

In an exemplary implementation, taking the case as an example where the first transistor T1 and the second transistor T2 in the first pixel circuit are all N-type thin film transistors, a working process of the first pixel circuit may include: a scan signal of the first scan signal line G1 controls the first transistor T1 to be opened, a data signal of the first data signal line Data1 passes through the first transistor T1 and enters the control electrode of the second transistor T2 and the first capacitor C1, and then the first transistor T1 is closed. Due to the storage function of the first capacitor C1, a voltage of the control electrode of the second transistor T2 may still maintain the voltage of the data signal, so that the second transistor T2 is in a turned-on state, and a drive current enters the first light emitting element D1 through the second transistor T2 to drive the first light emitting element D1 to emit light.

Figure 13:
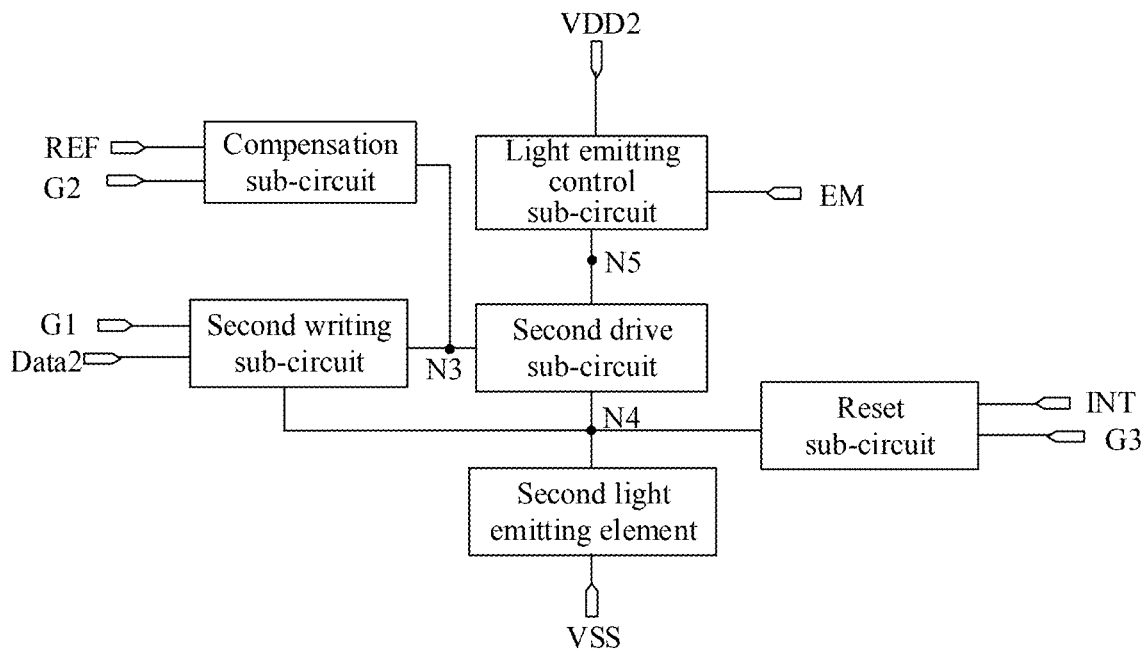
FIG. 13 is a schematic diagram of a structure of a second pixel circuit according to an embodiment of the present disclosure.

In some exemplary embodiments, as shown in FIG. 13, the second pixel circuit may include a second writing sub-circuit, a second drive sub-circuit, a reset sub-circuit, a compensation sub-circuit and a light emitting control sub-circuit.

The second writing sub-circuit is connected to the second data signal line Data1, the first scan signal line G1, the third node N3, and the fourth node N4 respectively, and is configured to supply a signal of the second data signal line Data2 to the third node N3 under the control of the signal of the first scan signal line G1, and store a voltage between the third node N3 and the second node N4. The second drive sub-circuit is connected to the third node N3, the fourth node N4 and the fifth node N5 respectively, and is configured to compensate a voltage of the fourth node N4 under control of the third node N3 and the fifth node N5; and generate, under control of the third node N3 and the fourth node N4, a drive current for driving the first light emitting element D1 to emit light. The reset sub-circuit is connected to the third scan signal line G3, the initial signal line INT and the fourth node N4, respectively, and is configured to supply a signal of the initial signal line INT to the fourth node N4 under the control of a signal of the third scan signal line G3. The compensation sub-circuit is connected to the second scan signal line G2, the reference signal line REF and the third node N3, respectively and is configured to supply a signal of the reference signal line REF to the third node N3 under control of a signal of the second scan signal line G2. The light emitting control sub-circuit is connected to the light emitting control signal line EM, the second power supply line VDD2 and the fifth node N5, respectively, and is configured to supply a power supply voltage of the second power supply line VDD2 to the fifth node N5 under control of a signal of the light emitting control signal line EM.

Figure 14:
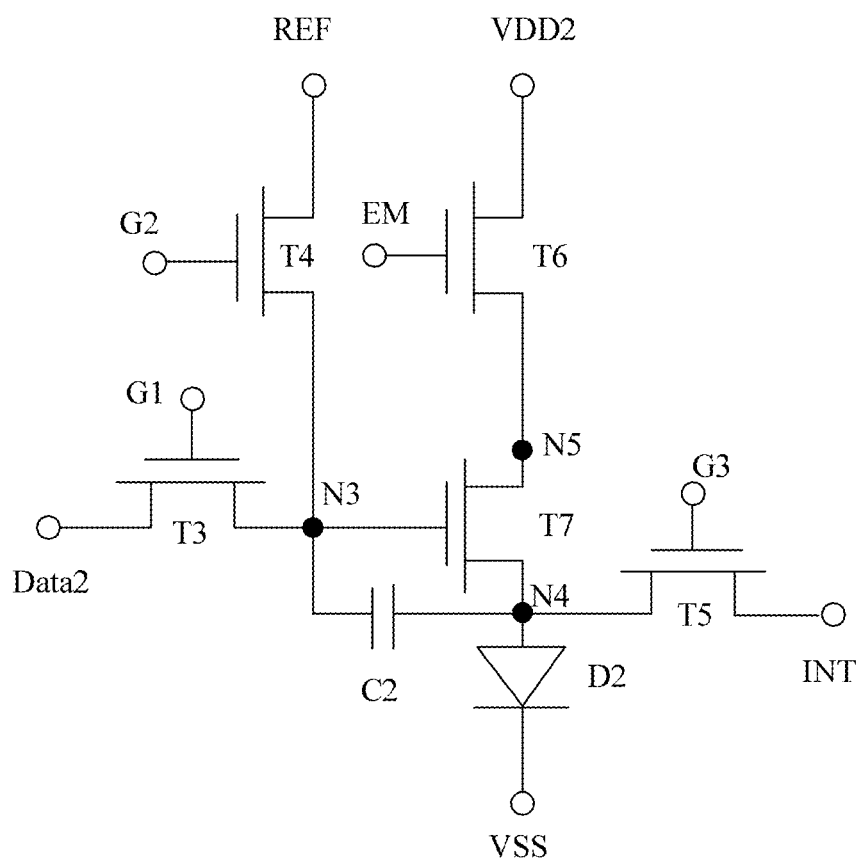
FIG. 14 is an equivalent circuit diagram of a second pixel circuit according to an embodiment of the present disclosure.

In some exemplary embodiments, as shown in FIG. 14, the second writing sub-circuit includes a third transistor T3 and a second capacitor C1, the compensation sub-circuit includes a fourth transistor T4, the reset sub-circuit includes a fifth transistor T5, the light emitting control sub-circuit includes a sixth transistor T6, and the second drive sub-circuit includes a seventh transistor T7. The third transistor T3, the fourth transistor T4, the fifth transistor T5 and the sixth transistor T6 are all switching transistors, the seventh transistor T7 is a drive transistor, and the second capacitor C2 is a storage capacitor.

A control electrode of the third transistor T3 is electrically connected to the first scan signal line G1, a first electrode of the third transistor T3 is electrically connected to the second data signal line Data2, and a second electrode of the third transistor T3 is electrically connected to the third node N3. A control electrode of the fourth transistor T4 is electrically connected to the second scan signal line G2, a first electrode of the fourth transistor T4 is electrically connected to the reference signal line REF, and a second electrode of the fourth transistor T4 is electrically connected to the third node N3. A control electrode of the fifth transistor T5 is electrically connected to the third scan signal line G3, a first electrode of the fifth transistor T5 is electrically connected to the initial signal line INT, and a second electrode of the fifth transistor T5 is electrically connected to the fourth node N4. A control electrode of the sixth transistor T6 is electrically connected to the light emitting control signal line EM, a first electrode of the sixth transistor T6 is electrically connected to the second power supply line VDD2, and a second electrode of the sixth transistor T6 is electrically connected to the fifth node N5. A control electrode of the seventh transistor T7 is electrically connected to the third node N3, a first electrode of the seventh transistor T7 is electrically connected to the fourth node N4, and a second electrode of the seventh transistor T7 is electrically connected to the fifth node N5. One end of the second capacitor C2 is electrically connected to the third node N3, and the other end of the second capacitor C2 is electrically connected to the fourth node N4. One end of the second light emitting element D2 is electrically connected to the fourth node N4, and the other end of the second light emitting element D2 is electrically connected to the voltage stabilizing line VSS.

In an exemplary implementation, as shown in FIG. 15, taking a case as an example where the third transistor T3 to the seventh transistor T7 in the second pixel circuit are all N-type thin film transistors, a working process of the second pixel circuit may include the followings.

In a first stage A1, referred to as a reset stage, a signal of the first scan signal line G1 is a low-level signal, and signals of the second scan signal line G2, the third scan signal line G3 and the light emitting control signal line EM are high-level signals. The signal of the third scan signal line G3 is a high-level signal, so that the fifth transistor T5 is turned on, and an initial voltage signal of the initial signal line INT is supplied to the fourth node N4 to initialize the second capacitor C2 to clear an original data voltage in the second capacitor C2. The signal of the first scan signal line G1 is a low-level signal, so that the third transistor T3 is turned off, and the second light emitting element D2 does not emit light in this stage.

In a second stage A2, referred to as a threshold compensation stage, the signals of the first scan signal line G1 and the third scan signal line G3 are low-level signals, and the signals of the second scan signal line G2 and the light emitting control signal line EM are high-level signals. The signal of the second scan signal line G2 is a high-level signal, so that the fourth transistor T4 is turned on, and a reference voltage signal of the reference signal line REF is written into the third node N3, causing the seventh transistor T7 to be turned on. The signal of the light emitting control signal line EM is a high-level signal, so that the sixth transistor T6 is turned on, at this time, a power supply voltage of the second power supply line VDD2 charges the seventh transistor T7, to continuously raise the voltage of the fourth node N4 until a gate-source voltage Vgs of the seventh transistor T7 reaches a threshold voltage Vth of the seventh transistor T7, and the seventh transistor T7 is automatically turned off.

In a third stage A3, referred to as a data writing stage, the signals of the second scan signal line G2, the third scan signal line G3 and the light emitting control signal line EM are low-level signals, and the signal of the first scan signal line G1 is a high-level signal. The signal of the light emitting control signal line EM is a low-level signal, so that the sixth transistor T6 is turned off, the signal of the first scan signal line G1 is a high-level signal, so that the third transistor T3 is turned on, and the data signal of the second data signal line Data2 is written to the third node N3 through the third transistor T3.

In a fourth stage A4, referred to as a light emitting stage, the signals of the first scan signal line G1, the second scan signal line G2 and the third scan signal line G3 are low-level signals, and the signal of the light emitting control signal line EM is a high-level signal. The signal of the light emitting control signal line EM is a high-level signal, so that the sixth transistor T6 is turned on. Due to a storage function of the second capacitor C2, a voltage of the control electrode of the seventh transistor T7 may still continue to maintain the voltage of the data signal, so that the seventh transistor T7 is in a turned-on state, and the power supply voltage output from the second power supply line VDD2 supplies a drive voltage to one end of the second light emitting element D2 through the turned-on sixth transistor T6 and seventh transistor T7 to drive the second light emitting element D2 to emit light.

In the driving process of the second pixel circuit, the drive current flowing through the seventh transistor T7 (a drive transistor) is determined by a voltage difference between the control electrode and the first electrode of the seventh transistor T7. Since a voltage of the second node N2 is Vdata−|Vth|, the drive current of the seventh transistor T7 is:

$$I=K*(Vgs-Vth)^2=K*[(Vdd-V\text{data}+|Vt|)-Vth]^2=K*[(Vdd-V\text{data}]^2$$

where I is a drive current flowing through the seventh transistor T7, i.e., the drive current for driving the second light emitting element D2, K is a constant, Vgs is a voltage difference between the gate electrode and the first electrode of the seventh transistor T7, Vth is a threshold voltage of the seventh transistor T7, Vdata is a data voltage output from the second data signal line Data2, and Vdd is a power supply voltage output by the second power supply line VDD2.

In an exemplary implementation, the first transistor T1 to the seventh transistor T7 may be P-type transistors or N-type transistors. Use of transistors of a same type in a pixel circuit may simplify a process flow, reduce process difficulties of a display panel, and improve a product yield. In some possible implementations, the first transistor T1 to the seventh transistor T7 may include P-type transistors and N-type transistors.

FIG. 4 is a schematic diagram of a planar structure of a display substrate according to an exemplary embodiment of the present disclosure. As shown in FIG. 4, in a plane parallel to the display substrate, the display substrate includes a display area and a mounting area, and in a plane perpendicular to the display substrate, the display substrate includes a base substrate, a drive structure layer disposed on the base substrate, and a light emitting element disposed on the drive structure layer. The drive structure layer of the mounting area includes a first pixel circuit, the drive structure layer of the display area includes a second pixel circuit, wherein the first pixel circuit includes a first transistor T1, a second transistor T2 and a first capacitor C1, and the second pixel circuit includes a third transistor T3, a fourth transistor T4, a fifth transistor T5, a sixth transistor T6, a seventh transistor T7 and a second capacitor C2. Each transistor includes an active layer, a control electrode, a first electrode and a second electrode, and each capacitor includes two opposite electrode plates.

In some exemplary embodiments, the drive structure layer includes a semiconductor layer, a first insulating layer, a first gate metal layer, a second insulating layer, a second gate metal layer, a third insulating layer, a first source-drain metal layer and a fourth insulating layer which are stacked on the base substrate.

The semiconductor layer includes a reference signal line REF and active layers of the plurality of transistors. The first gate metal layer includes control electrodes of the plurality of transistors, a first power supply line VDD1, a first scan signal line G1, a second scan signal line G2, a third scan signal line G3, a light emitting control signal line EM, a first electrode plate C1-1 of the first capacitor C1, and a third electrode plate C2-1 of the second capacitor C2. The second gate metal layer includes a second electrode plate C1-2 of the first capacitor C1, a fourth electrode plate C2-2 of the second capacitor C2, and an initial signal line INT. The first source-drain metal layer includes first electrodes and second electrodes of the plurality of transistors, a first connection line L1, a second connection line L2, a third connection line L3, a fourth connection line L4, a fifth connection line L5, a sixth connection line L6, a seventh connection line L7, an eighth connection line L8, a first data signal line Data1, a second data signal line Data2 and a second power supply line VDD2. The first electrodes and second electrodes of the plurality of transistors are respectively connected to two ends of the active layers of the plurality of transistors through via holes on the first insulating layer, the second insulating layer and the third insulating layer.

In some exemplary embodiments, as shown in FIG. 4, the control electrode 11 of the first transistor T1, the control electrode 31 of the third transistor T3 and the first scan signal line G1 are connected to each other to form an integrated structure. The first electrode 12 of the first transistor T1 and the first data signal line Data1 are connected to each other to form an integrated structure. The second electrode 13 of the first transistor T1 and the first connection line L1 are connected to each other to form an integrated structure. The first connection line L1 is connected to the control electrode 21 of the second transistor T2 and the first electrode plate C1-1 of the first capacitor C1 through the via holes on the second insulating layer and the third insulating layer. The first electrode 22 of the second transistor T2 and the third connection line L3 are connected to each other to form an integrated structure. The third connection line L3 is connected to the first power supply line VDD1 through via holes on the second insulating layer and the third insulating layer. The second power supply line VDD2 is electrically connected to the first power supply line VDD1 through via holes on the second insulating layer and the third insulating layer. The second electrode 23 of the second transistor T2 and the second connection line L2 are connected to each other to form an integrated structure. The second connection line L2 is connected to the second electrode plate C1-2 of the first capacitor C1 through a via hole on the third insulating layer.

In some exemplary embodiments, as shown in FIG. 4, the first electrode 32 of the third transistor T3 and the second data signal line Data2 are connected to each other to form an integrated structure. The second electrode 33 of the third transistor T3, the second electrode 43 of the fourth transistor T4 and the fifth connection line L5 are connected to each other to form an integrated structure. The fifth connection line L5 is connected to the control electrode 71 of the seventh transistor T7 and the third electrode plate C2-1 of the second capacitor C2 through via holes on the second insulating layer and the third insulating layer. The first electrode 42 of the fourth transistor T4 and the sixth connection line L6 are connected to each other to form an integrated structure. The sixth connection line L6 is connected to the reference signal line REF through the via holes on the first insulating layer, the second insulating layer and the third insulating layer. The control electrode 51 of the fifth transistor T5 and the third scan signal line G3 are connected to each other to form an integrated structure. The first electrode 52 of the fifth transistor T5 is electrically connected to the initial signal line INT through the via hole on the third insulating layer. The second electrode 53 of the fifth transistor T5 and the seventh connection line L7 are connected to each other to form an integrated structure. The seventh connection line L7 is electrically connected to the fourth electrode plate C2-2 of the second capacitor C2 through a via hole on the third insulating layer. The first electrode 72 of the seventh transistor T7 is electrically connected to the fourth electrode plate C2-2 of the second capacitor C2 through a via hole on the third insulating layer. The control electrode 61 of the sixth transistor T6 and the light emitting control signal line EM are connected to each other to form an integrated structure. The first electrode 62 of the sixth transistor T6 is electrically connected to the first power supply line VDD1 through via holes on the second insulating layer and the third insulating layer. The second electrode 63 of the sixth transistor T6, the eighth connection line L8 and the second electrode 73 of the seventh transistor T7 are connected to each other to form an integrated structure.

A structure of a display substrate according to an embodiment of the present disclosure is exemplarily described below through a preparation process of the display substrate. A "patterning process" mentioned in the present disclosure includes processing such as film layer deposition, photoresist coating, mask exposure, development, etching, and photoresist stripping. The deposition may be any one or more of sputtering, evaporation, and chemical vapor deposition. The coating may be any one or more of spray coating and spin coating. The etching may be any one or more of dry etching and wet etching. A "thin film" refers to a layer of a thin film manufactured from a material on a base using a process of deposition or coating. If the "thin film" does not need a patterning process in an entire manufacturing process, the "thin film" may also be called a "layer". If the "thin film" needs a patterning process in the entire manufacturing process, the "thin film" is called a "thin film" before the patterning process and is called a "layer" after the patterning process. The "layer" after the patterning process includes at least one "pattern". "A and B are disposed in a same layer" mentioned in the present disclosure means that A and B are simultaneously formed through a same patterning process. "An orthographic projection of A contains an orthographic projection of B" means that the orthographic projection of B falls within a range of the orthographic projection of A, or the orthographic projection of A covers the orthographic projection of B.

In some exemplary embodiments, the preparation process of the display substrate shown in FIG. 4 may include following steps.

(1) A pattern of a semiconductor layer is formed on a base substrate. Forming the pattern of the semiconductor layer on the base substrate includes: first depositing a layer of a buffer thin film on the base substrate to form a pattern of a buffer layer overlying the entire base substrate, and then depositing a layer of an active layer thin film and patterning the active layer thin film through a patterning process to form the pattern of the semiconductor layer disposed on the buffer layer, as shown in FIG. 5. The pattern of the semiconductor layer may include an active layer 10 of a first transistor T1, an active layer 20 of a second transistor T2, an active layer 30 of a third transistor T3, an active layer 40 of a fourth transistor T4, an active layer 50 of a fifth transistor T5, an active layer 60 of a sixth transistor T6 and an active layer 70 of a seventh transistor T7.

In some exemplary embodiments, as shown in FIG. 5, the active layer 10 of the first transistor T1 and the active layer 20 of the second transistor T2 are disposed in a mounting area 101, and the active layer 30 of the third transistor T3, the active layer 40 of the fourth transistor T4, the active layer 50 of the fifth transistor T5, the active layer 60 of the sixth transistor T6 and the active layer 70 of the seventh transistor T7 are disposed in a display area 100.

In some exemplary embodiments, as shown in FIG. 5, the active layer 10 of the first transistor T1 includes a first channel region, the active layer 30 of the third transistor T3 includes a third channel region, the active layer 40 of the fourth transistor T4 includes a fourth channel region, and the active layer 60 of the sixth transistor T6 includes a sixth channel region. The first channel region, the third channel region, the fourth channel region, and the sixth channel region each extend in a first direction X. The active layer 20 of the second transistor T2 includes a second channel region, and the active layer 70 of the seventh transistor T7 includes a seventh channel region, and the second channel region and the seventh channel region each extend in the second direction Y. The active layer 50 of the fifth transistor T5 includes a fifth channel region including a first sub-channel region and a second sub-channel region which are connected to each other, wherein the first sub-channel region extends in the first direction X and the second sub-channel region extends in the second direction Y.

In some exemplary embodiments, as shown in FIG. 5, the pattern of the semiconductor layer may further include a reference signal line REF for supplying a reference voltage signal to a second pixel circuit.

(2) A pattern of a first gate metal layer is formed. Forming the pattern of the first gate metal layer includes: sequentially depositing a first insulating thin film and a first metal thin film on the base substrate on which the aforementioned structures are formed, and patterning the first metal thin film through a patterning process to form a first insulating layer overlying the semiconductor layer and the pattern of the first gate metal layer disposed on the first insulating layer.

As shown in FIG. 6, the pattern of the first gate metal layer includes: a control electrode of the first transistor T1 to a control electrode of the seventh transistor T7, a first scan signal line G1, a second scan signal line G2, a third scan signal line G3, a light emitting control signal line EM, a first electrode plate C1-1 of a first capacitor C1, and a third electrode plate C2-1 of a second capacitor C2.

In some exemplary embodiments, as shown in FIG. 6, the pattern of the first gate metal layer further includes: a first power supply line VDD1 extending in the first direction X, wherein the first power supply line VDD1 includes a first connection part VDD1-1 located in the mounting area 101, a second connection part VDD1-2 located in the display area 100, and a first bent part VDD1-3 for connecting the first connection part VDD1-1 and the second connection part VDD1-2.

In some exemplary embodiments, the first power supply line VDD1 is connected to a second power supply line VDD2 to be formed subsequently, and the first electrode 62 of the sixth transistor T6 is connected to the first electrode 22 of the second transistor T2.

In some exemplary embodiments, as shown in FIG. 6, the first scan signal line G1, the control electrode 11 of the first transistor T1 and the control electrode 31 of the third transistor T3 are connected to each other to form an integrated structure. The second scan signal line G2 and the control electrode 21 of the second transistor T2 are connected to each other to form an integrated structure. The third scan signal line G3 and the control electrode 51 of the fifth transistor T5 are connected to each other to form an integrated structure. The light emitting control signal line EM and the control electrode 61 of the sixth transistor T6 are connected to each other to form an integrated structure.

In some exemplary embodiments, the first transistor T1, the third transistor T3, the fourth transistor T4 and the fifth transistor T5 are each a double-gate thin film transistor. As shown in FIG. 11, the control electrode 11 of the first transistor T1, the control electrode 31 of the third transistor T3, the control electrode 41 of the fourth transistor T4, and the control electrode 51 of the fifth transistor T5 each include two protrusions, thereby forming a thin film transistor with a double-gate structure.

In some exemplary embodiments, as shown in FIG. 2 and FIG. 6, the third scan signal line G3 includes a third connection part G3-1 located in the mounting area, a fourth connection part G3-2 located in the display area, and a second bent part G3-3 for connecting the third connection part G3-1 and the fourth connection part G3-2. The second bent part G3-3 is configured such that a distance h3 between the third connection part G3-1 and the first pixel opening region 1011 is smaller than a distance h4 between the fourth connection part G3-2 and the second pixel opening region 1001.

In some exemplary embodiments, the control electrode 21 of the second transistor T2 and the control electrode 71 of the seventh transistor T7 are disposed between the first scan signal line G1 and the third scan signal line G3.

In some exemplary embodiments, the control electrode 21 of the second transistor T2 and the first electrode plate C1-1 of the first capacitor C1 are connected to each other to form an integrated structure, and the control electrode 71 of the seventh transistor T7 and the third electrode plate C2-1 of the second capacitor C2 are connected to each other to form an integrated structure.

In some exemplary embodiments, after the pattern of the first metal layer is formed, the first metal layer may be used as a shield to perform a conductivity treatment on the semiconductor layer. The semiconductor layer in an area shielded by the first metal layer forms channel regions of the active layers of the first transistor T1 to the seventh transistor T7, and the semiconductor layer in an area not shielded by the first metal layer is made to be conductive.

(3) A pattern of a second gate metal layer is formed. Forming the pattern of the second gate metal layer includes: sequentially depositing a second insulating thin film and a second metal thin film on the base substrate on which the aforementioned structures are formed, and patterning the second metal thin film through a patterning process to form a second insulating layer overlying the first gate metal layer and the first insulating layer, and the pattern of the second gate metal layer disposed on the second insulating layer.

As shown in FIG. 7, the pattern of the second gate metal layer includes: a second electrode plate C1-2 and a fourth electrode plate C2-2, wherein a position of the second electrode plate C1-2 corresponds to a position of the first electrode plate C1-1, constituting the first capacitor C1, and a position of the third electrode plate C2-1 corresponds to a position of the fourth electrode plate C2-2, constituting the second capacitor C2.

In some exemplary embodiments, as shown in FIG. 7, the pattern of the second gate metal layer may further include: an initial signal line INT for supplying an initial voltage signal to the second pixel circuit.

In some exemplary embodiments, as shown in FIG. 2 and FIG. 7, the initial signal line INT includes a fifth connection part INT-1 located in the mounting area, a sixth connection part INT-2 located in the display area, and a third bent part INT-3 for connecting the fifth connection part INT-1 and the sixth connection part INT-2. The third bent part INT-3 is configured such that a distance h5 between the fifth connection part INT-1 and the first pixel opening region 1011 is smaller than a distance h6 between the sixth connection part INT-2 and the second pixel opening region 1001.

(4) A pattern of a third insulating layer is formed. Forming the pattern of the third insulating layer includes: depositing a third insulating thin film on the base substrate on which the aforementioned structures are formed, and patterning the third insulating thin film by a patterning process to form the pattern of the third insulating layer provided with a plurality of via holes. The plurality of via holes include a first via hole V1, a second via hole V2, a third via hole V3, a fourth via hole V4, a fifth via hole V5, a sixth via hole V6, a seventh via hole V7, an eighth via hole V8, a ninth via hole V9, a tenth via hole V10, an eleventh via hole V11, and a twelfth via hole V12, as shown in FIG. 8.

In some exemplary embodiments, the first via hole V1 is configured such that the first electrodes 12 to 72 and the second electrodes 13 to 73 of the plurality of transistors T1 to T7 to be formed subsequently are electrically connected to two ends of the active layers 10 to 70 of the plurality of transistors T1 to T7. The second via hole V2 is configured such that a first connection line L1 to be formed subsequently is electrically connected to the control electrode 21 of the second transistor T2 and the first electrode plate C1-1 of the first capacitor C1. The third via hole V3 is configured such that a third connection line L3 to be formed subsequently is electrically connected to the first power supply line VDD1. The fourth via hole V4 is configured such that a second connection line L2 to be formed subsequently is electrically connected to the second electrode plate C1-2 of the first capacitor C1. The fifth via hole V5 is configured such that a fourth connection line L4 to be formed subsequently is connected to the second electrode plate C1-2 of the first capacitor C1. The sixth via hole V6 is configured such that a fifth connection line L5 to be formed subsequently is connected to the control electrode 71 of the seventh transistor T7 and the third electrode plate C2-1 of the second capacitor C2. The seventh via hole V7 is configured such that a sixth connection line L6 to be formed subsequently is connected to the reference signal line REF. The eighth via hole V8 is configured such that the first electrode 52 of the fifth transistor T5 to be formed subsequently is electrically connected to the initial signal line INT; the ninth via hole V9 is configured such that a seventh connection line L7 to be formed subsequently is electrically connected to the fourth electrode plate C2-2 of the second capacitor C2. The tenth via hole V10 is configured such that the first electrode 72 of the seventh transistor T7 to be formed subsequently is electrically connected to the fourth electrode plate C2-2 of the second capacitor C2. The eleventh via hole V11 is configured such that the first electrode 62 of the sixth transistor T6 to be formed subsequently is electrically connected to the first power supply line VDD1. The twelfth via hole V12 is configured such that the second power supply line VDD2 to be formed subsequently is electrically connected to the first power supply line VDD1.

(5) A pattern of a first source-drain metal layer is formed. Forming the pattern of the first source-drain metal layer includes: depositing a third metal thin film on the base substrate on which the aforementioned structures are formed, and patterning the third metal thin film through a patterning process to form the pattern of the first source-drain metal layer. As shown in FIG. 8, the first source-drain metal layer includes the first electrode 12 of the first transistor T1 to the first electrode 72 of the seventh transistor T7, the second electrode 13 of the first transistor T1 to the second electrode 73 of the seventh transistor T7, the first connection line L1, the second connection line L2, the third connection line L3, the fourth connection line L4, the fifth connection line L5, the sixth connection line L6, the seventh connection line L7, the eighth connection line L8, the second power supply line VDD2, the first data signal line Data1 and the second data signal line Data2. The first electrodes and the second electrodes of the plurality of transistors are respectively connected to the corresponding active layers through two first via holes.

In some exemplary embodiments, the first electrodes 12 to 72 and the second electrodes 13 to 73 of the plurality of transistors T1 to T7 are connected to the two ends of the active layers 10 to 70 of the plurality of transistors T1 to T7 through a plurality of first via holes V1; the first electrode 12 of the first transistor T1 and the first data signal line Data1 are connected to each other to form an integrated structure. The second electrode 13 of the first transistor T1 and the first connection line L1 are connected to each other to form an integrated structure. The first connection line L1 is connected to the control electrode 21 of the second transistor T2 and the first electrode plate C1-1 of the first capacitor C1 through the second via hole V2. The first electrode 22 of the second transistor T2 and the third connection line L3 are connected to each other to form an integrated structure. The third connection line L3 is connected to the first power supply line VDD1 through the third via hole V3. The second electrode 23 of the second transistor T2 and the second connection line L2 are connected to each other to form an integrated structure. The second connection line L2 is connected to the second electrode plate C1-2 of the first capacitor C1 through the fourth via hole V4. The fourth connection line L4 is connected to the second electrode plate C1-2 of the first capacitor C1 through the fifth via hole V5.

In some exemplary embodiments, the first electrode 32 of the third transistor T3 and the second data signal line Data2 are connected to each other to form an integrated structure. The second electrode 33 of the third transistor T3, the second electrode 43 of the fourth transistor T4 and the fifth connection line L5 are connected to each other to form an integrated structure. The fifth connection line L5 is connected to the control electrode 71 of the seventh transistor T7 and the third electrode plate C2-1 of the second capacitor C2 through the sixth via hole V6. The first electrode 42 of the fourth transistor T4 and the sixth connection line L6 are connected to each other to form an integrated structure. The sixth connection line L6 is connected to the reference signal line REF through the seventh via hole V7. The first electrode 52 of the fifth transistor T5 is electrically connected to the initial signal line INT through the eighth via hole V8. The second electrode 53 of the fifth transistor T5 and the seventh connection line L7 are connected to each other to form an integrated structure. The seventh connection line L7 is electrically connected to the fourth electrode plate C2-2 of the second capacitor C2 through the ninth via hole V9. The first electrode 72 of the seventh transistor T7 is electrically connected to the fourth electrode plate C2-2 of the second capacitor C2 through the tenth via hole V10. The first electrode 62 of the sixth transistor T6 is electrically connected to the first power supply line VDD1 through the eleventh via hole V11. The second electrode 63 of the sixth transistor T6, the eighth connection line L8, and the second electrode 73 of the seventh transistor T7 are connected to each other to form an integrated structure. The second power supply line VDD2 is electrically connected to the first power supply line VDD1 through the twelfth via hole V12.

Through the above process, the drive structure layer has been prepared on the base substrate. The drive structure layer includes the semiconductor layer disposed on the base substrate, the first insulating layer disposed on the semiconductor layer, the first gate metal layer disposed on the first insulating layer, the second insulating layer disposed on the first gate metal layer, the second gate metal layer disposed on the second insulating layer, the third insulating layer disposed on the second gate metal layer and the first source-drain metal layer disposed on the third insulating layer. The scan lines and the data lines cross vertically to define sub-pixels, and the thin film transistors composed of the active layers, the control electrodes, the first electrodes and the second electrodes are disposed in the sub-pixels. The first insulating layer and the second insulating layer are also referred to as gate insulating (GI) layers, and the third insulating layer is also referred to as an interlayer dielectric (ILD) layer.

(6) A pattern of a fourth insulating layer is formed. Forming the pattern of the fourth insulating layer includes: coating a fourth insulating thin film on the base substrate on which the aforementioned patterns are formed, and forming the pattern of the fourth insulating layer overlying the first source-drain metal layer by a photolithography process of masking, exposure and development. The fourth insulating layer is provided with a thirteenth via hole V13 and a fourteenth via hole V14, wherein the thirteenth via hole V13 exposes the fourth connection line L4 and the fourteenth via hole V14 exposes the seventh connection line L7, as shown in FIG. 9. The fourth insulating layer is also called a planarization (PLN) layer.

(7) A pattern of an anode is formed. Forming the pattern of the anode includes: depositing a transparent conductive thin film on the base substrate on which the aforementioned patterns are formed, and patterning the transparent conductive thin film by a patterning process to form patterns of a first anode AN1 and a second anode AN2. The first anode AN1 is located in the mounting area and the second anode AN2 is located in the display area. The first anode AN1 is connected to the fourth connection line L4 through the thirteenth via hole V13, and the second anode AN2 is connected to the seventh connection line L7 through the fourteenth via hole V14, as shown in FIG. 4 and FIG. 9. The transparent conductive thin film may be made of indium tin oxide (ITO) or indium zinc oxide (IZO).

In some exemplary embodiments, an area of an orthographic projection of the first anode AN1 on the base substrate is smaller than an area of an orthographic projection of the second anode AN2 on the base substrate.

(8) A pattern of a pixel definition layer is formed. Forming the pattern of the pixel definition layer includes: coating a pixel definition thin film on the base substrate on which the aforementioned patterns are formed, and forming a pattern of a pixel definition layer by a photolithography process. The pattern of the pixel definition layer defines in each sub-pixel a pixel opening region exposing an anode, as shown in FIG. 10, the pattern of the pixel definition layer defines a first pixel opening region 1011 in the mounting area 101 and a second pixel opening region 1001 in the display area 100. The pixel definition layer may be made of polyimide, acrylic or polyethylene terephthalate, etc., and sizes of the first pixel opening region 1011 and the second pixel opening region 1001 may be defined according to actual needs. For example, an opening size of the first pixel opening region 1011 may be the same as an opening size of the second pixel opening region 1001, which is not limited in the embodiments of the present disclosure.

In some exemplary embodiments, a subsequent preparation process may include: forming an organic light emitting layer using an evaporation process, the organic light emitting layer being at least partially disposed within a pixel opening, the organic light emitting layer being connected to an anode; forming a cathode on the organic light emitting layer, the cathode being connected to the organic light emitting layer, and the organic light emitting layer emitting light of corresponding colors under driving of the anode and the cathode; and then forming an encapsulation layer, wherein the encapsulation layer may include a first encapsulation layer, a second encapsulation layer and a third encapsulation layer which are stacked, the first encapsulation layer and the third encapsulation layer may be made of an inorganic material, the second encapsulation layer may be made of an organic material, and the second encapsulation layer is disposed between the first encapsulation layer and the third encapsulation layer, which may ensure that external water vapor cannot enter a light emitting device.

In an exemplary implementation, the organic light emitting layer may at least include a hole injection layer, a hole transport layer, a light emitting layer and a hole block layer which are stacked on the anode. In an exemplary implementation, hole injection layers of all sub-pixels are connected together to form a common layer, hole transport layers of all sub-pixels are connected together to form a common layer, light emitting layers of adjacent sub-pixels may be slightly overlapped with each other or may be separate from each other, and hole blocking layers are connected together to form a common layer.

In an exemplary implementation, the base substrate may be a flexible substrate or a rigid substrate. The rigid substrate may be made of, but not limited to, one or more of glass and quartz. The flexible substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation, the flexible substrate may include a first flexible material layer, a first inorganic material layer, a semiconductor layer, a second flexible material layer, and a second inorganic material layer which are stacked, wherein materials of the first flexible material layer and the second flexible material layer may be polyimide (PI), polyethylene terephthalate (PET), or a surface-treated polymer soft film, or the like. Materials of the first inorganic material layer and the second inorganic material layer may be silicon nitride (SiNx) or silicon oxide (SiOx), or the like, for improving water and oxygen resistance of the substrate. The material of the semiconductor layer may be amorphous silicon (a-si).

In some exemplary embodiments, the first gate metal layer, the second gate metal layer and the first source-drain metal layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), and may be in a single-layer structure or a multi-layer composite structure, e.g., Mo/Cu/Mo, etc. The first insulating layer, the second insulating layer, the third insulating layer, the fourth insulating layer and the fifth insulating layer may be made of any one or more of silicon oxide (SiOx), silicon nitride (SiNx) and silicon oxynitride (SiON), and may be in a single layer, multiple layers, or a composite layer. The first insulating layer and the second insulating layer are referred to as gate insulating (GI) layers, and the third insulating layer is referred to as an interlayer dielectric (ILD) layer. The semiconductor layer may be made of a material, such as an amorphous indium gallium zinc oxide material (a-IGZO), zinc oxynitride (ZnON), indium zinc tin oxide (IZTO), amorphous silicon (a-Si), polycrystalline silicon (p-Si), sexithiophene or polythiophene, that is, the present disclosure is applicable to transistors manufactured based on oxide technology, silicon technology or organic technology. The fourth insulating layer may be made of an organic material, the transparent conductive thin film may be made of indium tin oxide (ITO) or indium zinc oxide (IZO), and the pixel definition layer may be made of polyimide, acrylic or polyethylene terephthalate. The cathode may be made of any one or more of magnesium (Mg), silver (Ag), aluminum (Al), copper (Cu) and lithium (Li), or an alloy made of any one or more of the above metals.

The structure shown in the present disclosure and the preparation process thereof are merely exemplary description. In an exemplary implementation, corresponding structures may be changed and patterning processes may be added or reduced according to actual needs, which is not specifically limited here in the present disclosure.

As can be seen from the structure and preparation process of the display substrate described above, in the display substrate according to the embodiment of the present disclosure, by disposing the first power supply line VDD1 intersecting the data line, there is no need to dispose the second power supply line VDD2 parallel to the data line in the mounting area 101, which effectively reduces the area occupied by the metal wires in the mounting area 101, increases the light transmittance of the mounting area 101, and improves the photographing functions of the front camera such as self-photographing and face recognition. In addition, the preparation process in the present disclosure may be compatible well with an existing preparation process, which is simple in process implementation, is easy to implement, and has a high production efficiency, a low production cost and a high yield.

Further, in the display substrate according to the embodiment of the present disclosure, by disposing a first pixel circuit in the drive structure layer in the mounting area 101 and disposing a second pixel circuit in the drive structure layer in the display area, and making the number of transistors in the first pixel circuit smaller than that in the second pixel circuit, the area occupied by the metal wires in the mounting area 101 is further reduced, the light transmittance of the mounting area 101 is increased, and the photographing functions of the front camera such as self-photographing and face recognition are improved.

The present disclosure further provides a method for preparing a display substrate, for preparing the display substrate according to the foregoing embodiments. In some exemplary embodiments, as shown in FIG. 16, the method for preparing a display substrate may include the following steps:

step S1, forming a drive structure layer on a base substrate, wherein the drive structure layer includes a buffer layer disposed on the base substrate, a semiconductor layer disposed on the buffer layer, a first insulating layer overlying the semiconductor layer, a first gate metal layer disposed on the first insulating layer, a second insulating layer overlying the first gate metal layer, a second gate metal layer disposed on the second insulating layer, a third insulating layer overlying the second gate metal layer, a first source-drain metal layer disposed on the third insulating layer, and a planarization layer overlying the first source-drain metal layer; at least one of the first gate metal layer and the second gate metal layer includes a first power supply line extending in a first direction, and the first source-drain metal layer includes a data line extending in a second direction, wherein the first direction intersects the second direction;

and step S2, forming a light emitting element on the drive structure layer.

In some exemplary embodiments, at least one of the first gate metal layer and the second gate metal layer further includes a light emitting control signal line and at least one scan signal line, wherein the light emitting control signal line and the scan signal line each extend in the first direction, and the first power supply line is located between the light emitting control signal line and at least one scan signal line.

In some exemplary embodiments, the first power supply line includes at least one first bent part, and the at least one first bent part extends in the second direction.

In some exemplary embodiments, the first source-drain metal layer further includes a second power supply line extending in the second direction, and the first power supply line is electrically connected to the second power supply line through a via hole on the third insulating layer, or through via holes on the third insulating layer and the second insulating layer.

In some exemplary embodiments, the display substrate includes a display area and a mounting area, the mounting area includes a first pixel circuit, and the display area includes a second pixel circuit, wherein the first pixel circuit and the second pixel circuit each include at least one transistor, and the number of transistors in the first pixel circuit is smaller than the number of transistors in the second pixel circuit.

The display substrate prepared by the method for preparing a display substrate according to the present disclosure has similar implementation principle and implementation effect as the display substrate described above, which will not be described further here.

The present disclosure further provides a display apparatus which includes the aforementioned display substrate. The display apparatus may be any product or component with a display function, such as a mobile phone, a tablet computer, a television, a display, a notebook computer, a digital photo frame, or a navigator, and the embodiments of the present invention are not limited thereto.

Although the implementations disclosed in the present disclosure are described as above, the described contents are only implementations which are used for facilitating the understanding of the present disclosure, and are not intended to limit the present invention. Any skilled person in the art to which the present disclosure pertains may make any modifications and variations in forms and details of implementation without departing from the spirit and scope of the present disclosure. However, the patent protection scope of the present invention should still be subject to the scope defined by the appended claims.

The invention claimed is:

1. A display substrate, wherein on a plane perpendicular to the display substrate, the display substrate comprises a base substrate, a buffer layer disposed on the base substrate, a semiconductor layer disposed on the buffer layer, a first insulating layer overlying the semiconductor layer, a first gate metal layer disposed on the first insulating layer, a second insulating layer overlying the first gate metal layer, a second gate metal layer disposed on the second insulating layer, a third insulating layer overlying the second gate metal layer, a first source-drain metal layer disposed on the third insulating layer, and a planarization layer overlying the first source-drain metal layer;
  at least one of the first gate metal layer and the second gate metal layer comprises a first power supply line extending in a first direction, and the first source-drain metal layer comprises a data line extending in a second direction, wherein the first direction intersects the second direction.

2. The display substrate according to claim 1, wherein at least one of the first gate metal layer and the second gate metal layer further comprises a light emitting control signal line and at least one scan signal line, the light emitting control signal line and the at least one scan signal line each extend in the first direction, and the first power supply line is located between the light emitting control signal line and the at least one scan signal line.

3. The display substrate according to claim 1, wherein the first power supply line comprises at least one first bent part, and the at least one first bent part extends in the second direction.

4. The display substrate according to claim 1, wherein the first source-drain metal layer further comprises a second power supply line extending in the second direction, and the first power supply line is electrically connected to the second power supply line through a via hole on the third insulating layer, or through via holes on the third insulating layer and the second insulating layer.

5. The display substrate according to claim 1, wherein the first source-drain metal layer further comprises an eighth connection line extending in the second direction, and an orthographic projection of the eighth connection line on the base substrate intersects an orthographic projection of the first power supply line on the base substrate.

6. The display substrate according to claim 1, wherein the semiconductor layer comprises a third channel region, a fourth channel region, a fifth channel region, a sixth channel region and a seventh channel region, each of the third channel region, the fourth channel region and the sixth channel region extends in the first direction, the seventh channel region extends in the second direction, the fifth channel region comprises a first sub-channel region and a second sub-channel region which are connected to each other, the first sub-channel region extends in the first direction, and the second sub-channel region extends in the second direction.

7. The display substrate according to claim 1, wherein the semiconductor layer comprises a reference signal line for supplying a reference voltage signal, and the reference signal line extends in the first direction.

8. The display substrate according to claim 1, wherein the second gate metal layer comprises an initial signal line for supplying an initial voltage signal; and
  the initial signal line comprises at least one third bent part, and the at least one third bent part extends in the second direction.

9. The display substrate according to claim 1, wherein the display substrate comprises a display area and a mounting area, the mounting area comprises a first pixel circuit, and the display area comprises a second pixel circuit,
  wherein each of the first pixel circuit and the second pixel circuit comprises at least one transistor, and the number of transistors in the first pixel circuit is smaller than the number of transistors in the second pixel circuit.

10. The display substrate according to claim 9, wherein the display substrate further comprises anodes disposed on the planarization layer,
  wherein the anodes comprise a first anode and a second anode, the first anode is located in the mounting area, the second anode is located in the display area, and an area of an orthographic projection of the first anode on the base substrate is smaller than an area of an orthographic projection of the second anode on the base substrate.

11. A display apparatus, comprising the display substrate according to claim 1.

12. A method for preparing a display substrate, comprising:
  forming a drive structure layer on a base substrate, wherein the drive structure layer comprises a buffer layer disposed on the base substrate, a semiconductor layer disposed on the buffer layer, a first insulating layer overlying the semiconductor layer, a first gate metal layer disposed on the first insulating layer, a second insulating layer overlying the first gate metal layer, a second gate metal layer disposed on the second insulating layer, a third insulating layer overlying the second gate metal layer, a first source-drain metal layer disposed on the third insulating layer, and a planarization layer overlying the first source-drain metal layer; at least one of the first gate metal layer and the second gate metal layer comprises a first power supply line extending in a first direction, and the first source-drain metal layer comprises a data line extending in a second direction, wherein the first direction intersects the second direction; and
  forming a light emitting element on the drive structure layer.

* * * * *